(12) United States Patent
Yamazaki et al.

(10) Patent No.: US 7,662,011 B2
(45) Date of Patent: Feb. 16, 2010

(54) METHOD OF SEALING AN ORGANIC EL DISPLAY PROVIDED WITH AN ADHESIVE LAYER OVER A PERIPHERAL INSULATING LAYER

(75) Inventors: Shunpei Yamazaki, Tokyo (JP); Jun Koyama, Kanagawa (JP); Takeshi Nishi, Kanagawa (JP); Rumo Satake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 625 days.

(21) Appl. No.: 11/319,048

(22) Filed: Dec. 27, 2005

(65) Prior Publication Data

US 2006/0199461 A1  Sep. 7, 2006

Related U.S. Application Data

(62) Division of application No. 10/078,187, filed on Feb. 19, 2002, now Pat. No. 6,992,439.

(30) Foreign Application Priority Data

Feb. 22, 2001  (JP) .............................. 2001-045925

(51) Int. Cl.
*H01L 51/56* (2006.01)
*H01L 51/52* (2006.01)

(52) U.S. Cl. .............................. 445/25; 445/24; 427/66
(58) Field of Classification Search .................. 445/24, 445/25; 427/66
See application file for complete search history.

(56) References Cited

U.S. PATENT DOCUMENTS

| | | | |
|---|---|---|---|
| 4,618,802 A | 10/1986 | Schrank | |
| 5,742,129 A | 4/1998 | Nagayama et al. | ........... 315/167 |
| 6,284,983 B1 | 9/2001 | Lutschounig et al. | |
| 6,303,963 B1 | 10/2001 | Ohtani et al. | ............... 257/350 |
| 6,359,606 B1 | 3/2002 | Yudasaka | |
| 6,380,672 B1 | 4/2002 | Yudasaka | ..................... 313/504 |
| 6,489,719 B1 | 12/2002 | Young et al. | |

(Continued)

FOREIGN PATENT DOCUMENTS

EP  0 180 173 A2  5/1986

(Continued)

*Primary Examiner*—Mariceli Santiago
(74) *Attorney, Agent, or Firm*—Cook Alex Ltd.

(57) ABSTRACT

A structure of a display device in which water is prevented from passing through the side faces of a display device using an organic light-emitting element and a gap between substrates is made uniform. On the first substrate having the light-emitting element provided thereon, the thicknesses of the layers deposited in the peripheral area, the pixel portion and the driving circuit portion are equalized with each other. Furthermore, an adhesive is provided as thin as possible in the peripheral area of the first substrate so as to bond a second substrate to the first substrate. As a result, the distance between the first substrate and the second substrate can be made uniform throughout the peripheral area of the first substrate, the pixel portion and the driving circuit. Moreover, since a protective film overlying the organic light-emitting element is also provided on the side faces of the second insulating film, water is prevented from entering the display device through its side faces.

31 Claims, 14 Drawing Sheets

U.S. PATENT DOCUMENTS

| | | |
|---|---|---|
| 6,559,594 B2 | 5/2003 | Fukunaga et al. ............ 313/506 |
| 6,611,098 B2 * | 8/2003 | Mori et al. ................... 313/512 |
| 6,664,732 B2 | 12/2003 | Yamazaki et al. ........... 313/506 |
| 6,734,839 B2 | 5/2004 | Yudasaka |
| 6,798,132 B2 | 9/2004 | Satake ......................... 313/495 |
| 2001/0023661 A1 * | 9/2001 | Hiroki et al. ................. 427/422 |

FOREIGN PATENT DOCUMENTS

| | | |
|---|---|---|
| EP | 0 961 525 A1 | 12/1999 |
| JP | 61-114492 | 6/1986 |
| JP | 3-84594 | 8/1991 |
| JP | 5-182759 | 7/1993 |
| JP | 08-227276 | 9/1996 |
| JP | 10-172757 | 6/1998 |
| JP | 10-289784 | 10/1998 |
| JP | 11-74073 | 3/1999 |
| JP | 11-121165 | 4/1999 |
| JP | 11339958 A * | 12/1999 |
| JP | 2000-40586 | 2/2000 |
| JP | 2000-68046 | 3/2000 |
| JP | 2000-164349 | 6/2000 |
| JP | 2000-512800 | 9/2000 |
| JP | 2001-23771 | 1/2001 |
| JP | 2001-42302 | 2/2001 |
| JP | 2001223079 A * | 8/2001 |
| WO | WO 98/47320 A2 | 10/1998 |
| WO | WO 00/76276 A1 | 12/2000 |

* cited by examiner

METHOD OF SEALING AN ORGANIC EL DISPLAY PROVIDED WITH AN ADHESIVE LAYER OVER A PERIPHERAL INSULATING LAYER

This application is a divisional of U.S. application Ser. No. 10/078,187, filed on Feb. 19, 2002 now U.S. Pat. No. 6,992,439.

BACKGROUND OF THE INVENTION

1. Field of the Invention

The present invention relates to a display device using an organic light-emitting element and a manufacturing method thereof. More specifically, the present invention relates to a sealing structure for protecting an organic light emitting element deposited onto a substrate, and to a display device, in which an element substrate (a substrate having at least an element such as a TFT) and a sealing substrate are provided in the proximity, and a manufacturing method thereof.

Throughout the specification, the term "organic light-emitting element" indicates an element including an organic compound film sandwiched between two electrodes to achieve light emission. One of the representative organic light-emitting elements is a light-emitting element using an organic light-emitting diode (OLED). The OLED includes an organic compound film sandwiched between two electrodes. Holes are injected to one of the electrodes while electrons are injected to the other electrode. The holes and the electrons are therefore coupled with each other to cause light emission.

2. Description of the Related Art

In recent years, display devices using the organic light-emitting element are actively studied. The display devices using the organic light-emitting element can be reduced in weight as well as in thickness as compared with a conventional CRT, and thus their application to various uses is attempted. Portable telephones and personal digital assistants (PDAs) can be now connected to the Internet, resulting in a remarkable increase in the amount of information to be displayed as images. Accordingly, there arises an increasing demand for display devices to perform color display and to enhance their definition.

On the other hand, light weight is an important factor for the display device included in such a portable digital assistant. For example, a portable phone having less than 70 g in weight is now on the market. In order to reduce the weight of the portable digital assistant itself, a throughout review as to the weight of almost all the used components such as individual electric components, a body and a battery is performed. In order to realize a further reduction in weight, however, it is necessary to lighten the display device itself.

Since a display device including a pixel portion formed with an organic light-emitting element is a self-light emitting type display device, a light source such as a backlight is not required as is needed in liquid crystal display devices. Therefore, such a display device using the organic light-emitting element is promising means of realizing light weight and a thin body.

The organic light-emitting element is capable of emitting blue light and thus allows the realization of a full-color display self-light emitting type display device. However, various deterioration phenomena are observed in the organic light-emitting element. It is urgently required to eliminate such phenomena as obstacles to the practical use of the organic light-emitting element.

For example, the dark spot, which is a non-light emitting point defect appearing in a pixel portion, is regarded as a problem that remarkably reduces the display quality. It is said that the dark spot is a progressive defect and the mere presence of water increases the number of dark spots even if the organic light-emitting element is not operated. It is believed that the cause of the dark spot is a high reactivity of a cathode containing an alkali metal or an alkali earth metal with water or oxygen.

Therefore, in the display device using the organic light-emitting element, a desiccant is placed in a sealed region surrounded by an element substrate, a sealing substrate and a sealing agent so that water and oxygen do not enter the organic light-emitting element. FIG. 15 is a cross-sectional view showing a display device using a conventional organic light-emitting element. An element substrate 301 made of glass, on which an organic light-emitting element 307 is provided, and a sealing substrate 303 provided so as to be opposed to the element substrate 301, are bonded to each other through a sealing agent 302 so that the organic light-emitting element is prevented from being exposed to the outside air. A fine protective film 308 having a thickness of 100 nm to 500 nm may be further provided on the organic light-emitting element 307 so as to prevent water from entering the organic light-emitting element 307. A sealed region is filled with dry air. A distance between the element substrate 301 and the sealing substrate 303 is adjusted by mixing a filler, a spacer or the like into the sealing agent 302.

The sealing substrate 303 has a hollow region made of a metal such as stainless steel or aluminum, which is processed into a dish-like shape. A desiccant 304 and a film sheet 305 are provided in the hollow region. The desiccant 304 has moisture-absorption characteristics so as to absorb water penetrating into the sealed region to prevent the degradation of the organic light-emitting element. If the desiccant 304 gets into the display area where the organic light-emitting element 307 is provided, display performance of the device is deteriorated. Thus, the film sheet 305 having a permeability to gas and vapor is bonded to the sealing substrate 303, thereby confining the desiccant 304 within a concave portion of the sealing substrate 303. The film sheet 305 has a thickness of 100 to 300 μm. In consideration of flexion of the film sheet 305 generated by the weight of the desiccant 304, a gap between the film sheet 305 and the organic light-emitting element 307 where they are bonded to each other so as not to be in contact is required to be 50 to 200 μm. Accordingly, with the film sheet 305 provided in the hollow region of the sealing substrate 303, the hollow region is required to have a depth of at least 150 to 500 μm. The placement of the film sheet 305 or the like increases the distance between the element substrate and the sealing substrate, making it difficult to reduce the thickness of the display device. In view of this problem, the present invention has been made and a first object of the present invention is to provide a display device, in which the element substrate 301 and the sealing substrate 303 can be provided in close proximity to each other so as to enable the reduction in thickness of the device, and a manufacturing method thereof.

Conventionally, in order to provide the hollow region in the sealing substrate where the desiccant is placed, it is required to use a sealing substrate made of a metal material that is easy to process. In the display device including the sealing substrate made of metal, however, the element substrate 301 made of glass can be uniquely used as a substrate through which light emitted from the organic light-emitting element is output. Thus, if thin film transistor (TFT) elements are provided on the element substrate, light emitted from the organic light-emitting element is obtained from the side of the element substrate through the TFT elements, resulting in lowered brightness of the emitted light. Moreover, the thinner the element substrate becomes, the lower the shock resistance becomes. As a result, the element substrate is likely to be fragile. In particular, when the sealing substrate made of metal and the element substrate made of glass are bonded to each other, the distortion is generated by a sudden change in temperature due to the difference in thermal expansion coefficient, causing the cracking in the element substrate.

Accordingly, a second object of the present invention is to provide a display device achieving a bright display with good visibility by increasing the brightness of light emitted from the organic light-emitting element and a manufacturing method thereof. In addition, a third object of the present invention is to provide a display device, in which breakage due to a sudden change in temperature is restrained and a manufacturing method thereof.

Furthermore, the sealing agent placed on the side faces of the display device is made of an organic resin material, which has a high moisture permeability as compared with inorganic type glass materials and metal materials. For example, the organic resin material has a permeability of 15 $g/m^2$ for 24 hr. to 30 $g/m^2$ for 24 hr. at 60° C. and a humidity of 90%. Although the amount of water penetrating into the sealed region through the element substrate made of glass from the front side of the display device and the amount of water penetrating into the sealed region through the sealing substrate made of a metal material from the rear side of the display device are negligibly small, water which enters the sealed region through the sealing agent having a high moisture permeability from the side faces of the display device causes the deterioration of the organic light-emitting element. Thus, it is necessary to take measures to cope with this problem.

Since the amount of water passing through the sealing agent is determined by the product of the area of the sealing agent exposed to the outside air multiplied by the moisture permeability of the sealing agent, it is preferred that the area of the sealing agent exposed to the outside air is as small as possible, that is, the sealing agent is as thin as possible. However, the sealing agent serves not only to bond the sealing substrate and the element substrate to each other, but also to control the distance between the sealing substrate and the element substrate. Thus, it is necessary to determine the thickness of the sealing agent in consideration of the distance between the element substrate and the sealing substrate so that the element substrate and the sealing substrate do not come in contact with each other to break the organic light-emitting element provided on the element substrate and the transistors that make a current flow through the organic light-emitting element.

In view of the above problem, a fourth object of the present invention is to provide a display device with enhanced reliability, in which the element substrate and the sealing substrate can be provided close to each other and the amount of water vapor passing from the side faces of the element device through an organic resin material such as a sealing agent to enter the sealed region is reduced so as to prolong the lifetime of the organic light-emitting element; and a manufacturing method thereof.

Alternatively, in order to reduce the amount of water entering from the side faces of the display device, a protective film having a low permeability to a fine gas and water vapor may be considered to be provided between the sealing agent and the outside air so as to contact the sealing agent. However, the formation of the protective film on the side faces of the sealing agent by using a vacuum apparatus after bonding the element substrate and the sealing substrate to each other through the sealing agent leads to an increase in manufacturing cost, thereby decreasing the advantages of the organic light-emitting element which is easily manufactured at a low cost. In addition, since a stress is applied onto a material that is applied onto the substrate by a dispenser system so as to cure the sealing agent, the sealing agent after curing has a gently undulating shape in the thickness direction between the substrates on the side faces of the sealing agent as well as in the width direction perpendicular to the thickness direction of the side faces of the sealing agent. It is difficult to form the protective film on such side faces of the sealing agent, whereby providing a part where the protective film is not formed.

As described above, it is difficult to reduce the amount of water passing through the sealing agent provided on the side faces of the display device. Accordingly, in the display device using the organic light-emitting element, there is a great need to reduce water passing through the side faces of the display device. Consequently, the fourth object of the present invention is important.

In addition to the appropriate realization of the first to fourth objects, the present invention enables the reduction in the number of paths through which water passes from the outside air and the control for making the distance between the element substrate (first substrate) and the sealing substrate (second substrate) uniform.

SUMMARY OF THE INVENTION

As one example of a structure of the present invention, when a bank is to be formed on the element substrate, an insulating film is formed in a closed curve form in the periphery of the element substrate in the same step of forming the bank. Then, an adhesive is formed on the insulating layer, which serves to bond the element substrate and the sealing substrate to each other. The adhesive is formed to have a small thickness, i.e., 0.05 to 0.5 µm. With the structure of the present invention, it is possible to provide the element substrate and the sealing substrate in the proximity, thereby achieving the first object of the present invention, that is, the reduction in thickness of the display device.

Furthermore, if substrates made of glass having light transmittance are used as the element substrate and the sealing substrate, light emitted from the organic light-emitting element can be obtained from the side of the sealing substrate. In this case, an aperture ratio of each pixel is determined, independently of the ratio of the number of TFT elements to a pixel. As a result, display with high brightness can be realized, thereby achieving the second object of the present invention. In addition, the breakage due to a sudden change in temperature is restrained, because the element substrate and the sealing substrate have the same thermal expansion coefficient. Consequently, the third object of the present invention is achieved.

Furthermore, if the element substrate and the sealing substrate are provided in the proximity, the amount of water passing through the organic resin material (adhesive), which serves to bond the element substrate and the sealing substrate to each other, is reduced. As a result, the lifetime of the organic light-emitting element is expected to be prolonged, thereby achieving the fourth object of the present invention.

In the case where the element substrate and the sealing substrate are provided in the proximity, protections of the organic light-emitting element provided on the element substrate and of the transistors become important. Moreover, how and where to provide the desiccant becomes also an important factor, depending on the desired lifetime. This point will be appropriately described.

A method of enhancing the uniformity between the element substrate and the sealing substrate will be also appropriately described.

DESCRIPTION OF THE PREFERRED EMBODIMENT MODES

Hereinafter, the preferred embodiment modes of the present invention will be described with reference to the accompanying drawings.

Figure 1:
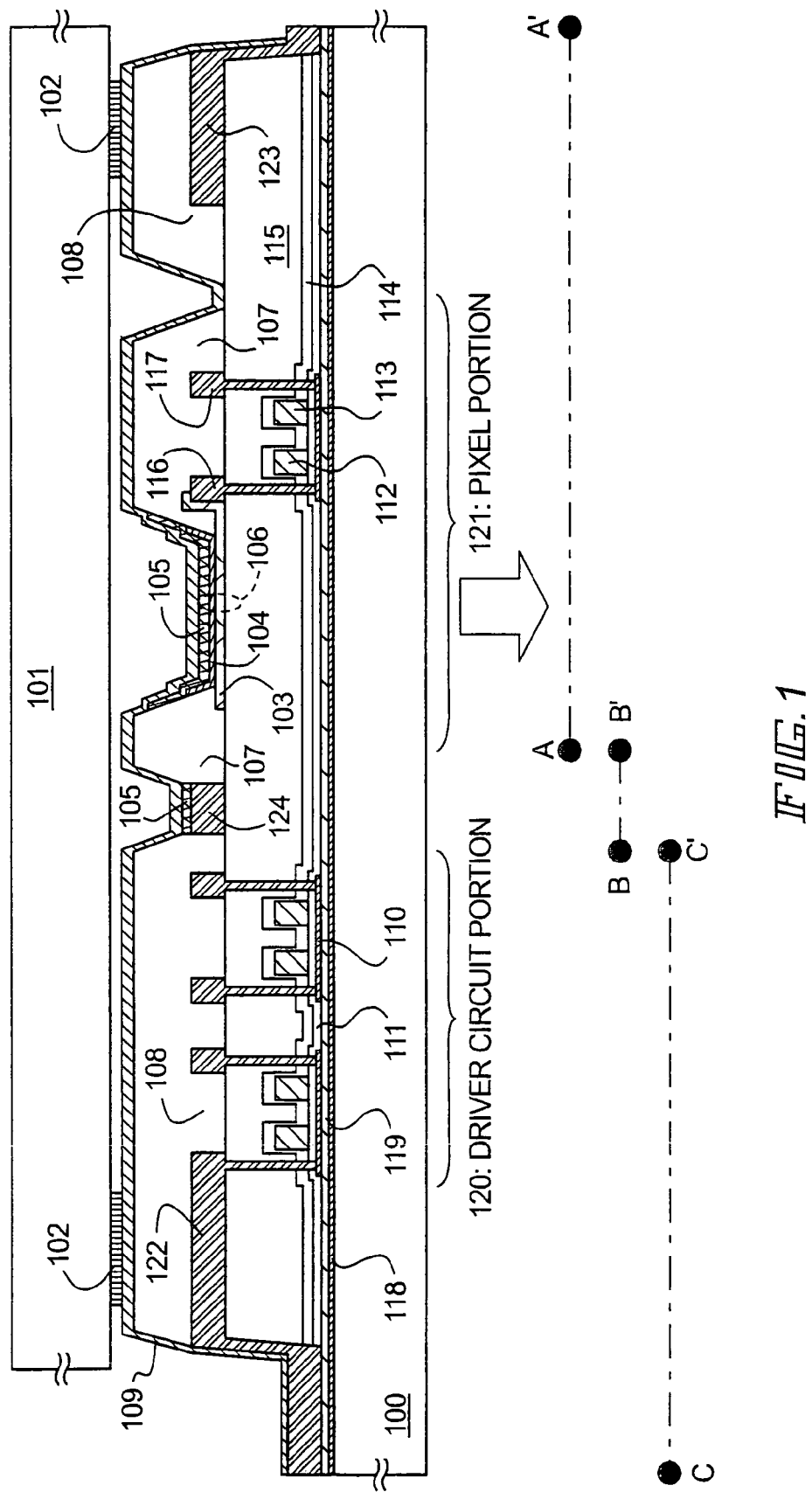
FIG. 1 is a cross-sectional view showing a display device using an organic light-emitting element according to Embodiment Mode 1.

One example of the present invention is now described with reference to a cross-sectional view shown in FIG. 1. FIG. 1 shows a display device using an organic light-emitting element according to the present invention. A first substrate 100 is a light transmitting substrate made of glass. A TFT in a pixel portion 121 and a TFT in a driving circuit portion 120 provided in the periphery of the pixel portion 121 are formed on the first substrate 100. Base films 118 and 119 made of an inorganic material are provided on the first substrate 100. Each of the TFTs in the pixel portion and the driving circuit portion on the first substrate, includes: a semiconductor film 110; a gate insulating film 111 covering the semiconductor film 110; gate electrodes 112 and 113 provided above a channel region of the semiconductor film 110 through the gate insulating film 111; a first interlayer insulating film 114 made of an inorganic material, covering the gate electrodes 112 and 113 and the gate insulating film 111; a second interlayer insulating film 115 made of an organic material, provided on the first interlayer insulating film 114; and a drain electrode 116, a source electrode 117 and a wiring 122, formed by patterning the same conductor layer. One end of the wiring 122 is connected to the semiconductor film 110 in the driving circuit portion, and the other end serves as an external input terminal provided outside a sealed region. An FPC (flexible print circuit) is connected to the external input terminal through a first electrode 103 made of an ITO film.

An organic light-emitting element 106 consisting of a laminate of the first electrode 103, an organic compound film 104 and a second electrode 105 is provided on the second interlayer film 115. The first electrode 103 is an anode, for which a transparent conductive film having light transmittance, for example, an ITO (Indium Tin Oxide) film can be used. The second electrode 105 is a cathode, for which a thin metal film containing an alkali metal or an alkali earth metal such as MgAg or AlLi can be used. In order to prevent the breaking of the organic compound film 104 at the end of the first electrode 103 due to the weight of the first electrode 103 to cause the short-circuit between the first electrode 103 and the second electrode 105 at the broken point, a bank is provided so as to cover the end of the first electrode 103. The organic compound film 104 is provided along the gentle slope of the bank, and then the second electrode 105 is provided thereon, so that the short-circuit between the first electrode 103 and the second electrode 105 can be prevented. In the present invention, an insulating film having a thickness of 1 to 10 μm is patterned to form a first insulating film 107 serving as the bank and a second insulating film 108 provided in the periphery of the first substrate 100.

For the propose of restraining water from entering the display device through its side faces and the reaction between the organic light-emitting element and water, a protective film 109 is formed as an uppermost layer on the first substrate 100 so as to cover the second electrode 105, the first and second insulating films 107 and 108 and the second interlayer insulating film 115. At the same time, the protective film 109 is also formed on the organic light-emitting element 106, the side faces of the second interlayer insulating film 115, and the side faces of the second insulating film 108. Since the side faces of the second interlayer insulating film 115 and the second insulating film 108 are insulated from the outside air by the fine and hard protective film 109, water is prevented from passing through the side faces of the display device to enter the sealed region. As the protective film 109, a silicon nitride film or a DLC (Diamond like Carbon) film may be used. The DLC film is optimal as the protective film 109 because the DLC film is very hard and has excellent insulation properties, and thus can have a low gas permeability to vapor, oxygen or the like. In this manner, the element substrate 100, on which the organic light-emitting element 106 is formed, is completed.

An adhesive 102 is provided above the second insulating film 108 which is provided in the periphery of the element substrate 100 so as to bond the element substrate 100 and a sealing substrate 101 to each other. The sealing substrate 101 is a second substrate having light transmittance. The adhesive 102 has a small thickness, i.e., a thickness of 0.05 to 0.5 μm, preferably; 0.05 to 0.2 μm. If the total thickness of the layers deposited under the adhesive 102 and the total thickness of the layers deposited in the pixel portion where the first insulating film 107 is provided, are adjusted to be equal to each other, the distance between the first substrate 100 and the second substrate 101 can be made uniform throughout the pixel portion and the peripheral area of the first substrate 100. More desirably, in further consideration of the thickness of the adhesive 102, when the sum of the thickness of the adhesive 102 and the total thickness of the underlying layers in the peripheral area of the first substrate 100 is designed to be equal to the total thickness of the deposited layers in the pixel portion where the first insulating film is provided or to the total thickness of the deposited layers in the driving circuit portion, the distance between the first substrate 100 and the second substrate 101 can be more certainly uniform throughout the pixel portion and the peripheral area of the first substrate 100. To achieve such uniformity, a film having a dominant thickness in the laminate, for example, a second interlayer insulating film, a bank and an insulating film formed in the same manufacturing step as the bank, is required to be provided in the pixel portion, the driving circuit portion and the peripheral area of the first substrate 100.

The reduction in thickness of the adhesive 102 allows the reduction in the amount of water passing from the outside air through the side faces of the adhesive 102 to enter the sealed region. Since an adhesive having adhesion and such characteristics that provide a thickness of 0.05 to 0.5 µm, preferably, 0.05 to 0.2 µm can be used in the present invention, even a conventional sealing agent may be used as an adhesive of the present invention as long as it has a thickness of 0.05 to 0.5 µm, preferably, 0.05 to 0.2 µm.

The sealed region surrounded by the element substrate 100, the sealing substrate 101 and the adhesive 102 is filled with a dry gas. An inert gas such as nitrogen, argon, or helium is used as the dry gas. The dry gas contains a very small amount of the remaining water. However, since the adhesive 102 has a small thickness, i.e., a thickness of 0.05 to 0.5 µm, preferably, 0.05 to 0.2 µm, the volume of the sealed region, that is, the volume of the dry gas filling the sealed region is also small. Thus, the amount of water remaining in the dry gas within the sealed region is correspondingly small.

Moreover, since the moisture permeability of the organic resin film tends to be lowered if its width is large, it is preferred that the width of the organic resin film is increased by providing the second insulating film made of the organic resin film, which is formed in contact with the protective films on the side faces of the display device, so as to cover not only the underlying portion of the adhesive 102 but also the driving circuit portion 120. However, if the area of a frame region is increased with the increase in the width of the second insulating film, the display performance is degraded. Thus, the width of the second insulating film is preferably 100 to 5000 µm. The designer can appropriately design the width of the second insulating film because it is determined by a photomask.

According to the present invention, since the protective film can be provided without unevenness on the side faces of the display device in simple manufacturing steps, the amount of water passing through the side faces of the display device to enter inside can be reduced. The organic resin material, which is exposed to the outside air on the side faces of the display device, serves as an adhesive. Since the adhesive can be made thinner as far as the material permits, the area of the adhesive exposed to the outside air can be reduced to be as small as possible.

In addition, the use of the second substrate made of glass as the sealing substrate allows the thermal expansion coefficients of the element substrate and the sealing substrate to be equal to each other. As a result, since the element substrate and the sealing substrate have the same thermal expansion coefficient, the cracking in the substrates in accordance with a change in temperature can be prevented from occurring even if the temperature of the environment where the device is used is suddenly changed. The present invention is particularly effective when the strength of the substrates is lowered with the reduction of their thickness. Certainly, since the element substrate and the sealing substrate are both made of glass having light transmittance, light emitted from the organic light-emitting element can be obtained from the side of the element substrate, with a first electrode of the organic light-emitting element being light transmissive and a second electrode being light reflective. On the contrary, light emitted from the organic light-emitting element can be obtained from the side of the sealing substrate, with the first electrode being light reflective and the second, electrode being light transmissive. The designer may appropriately determine from which substrate, i.e., the element substrate or the sealing substrate, light emitted from the organic light-emitting element is to be obtained.

The structure shown in FIG. 1 is intended to prolong the lifetime of the light-emitting element by providing the fine protective film on the side faces of the display device and the organic light-emitting element. The long-term reliability of the organic light-emitting element can be ensured by various methods in the embodiment modes described below. Furthermore, a method of providing a desiccant in the above structure will be also described. With the following embodiment modes, the uniformity of the distance between the first substrate and the second substrate of the organic light-emitting element can be improved by various methods. The following embodiment modes may be combined. Hereinafter, the present invention will be described in detail by way of example.

EMBODIMENT MODES

Embodiment Mode 1

A first embodiment mode of the present invention will be described with reference to FIG. 1. FIG. 1 is a cross-sectional view showing an active-matrix display device using an organic light-emitting element. The components constituting the display device shown in FIG. 1 will be described in the order of formation.

A driving circuit portion 120 and a pixel portion 121 are formed by using TFTs on a first substrate 100. As the first substrate 100, a substrate made of glass such as barium borosilicate glass, alumino borosilicate glass, or quartz glass is used.

The TFT in the driving circuit portion 120 and the TFT in the pixel portion 121 are provided on base films 118 and 119 having insulation properties. A silicon nitride oxide film having a thickness of 10 to 100 nm is formed as the base film 118, whereas a silicon nitride oxide film having a thickness of 20 to 200 nm is formed as the base film 119. In this embodiment mode, silicon nitride oxide films having different film qualities are deposited to form the base films 118 and 119.

The TFT is constituted by a semiconductor film 110, a gate insulating film 111, gate electrodes 112 and 113, a first interlayer insulating film 114, a second interlayer insulating film 115, a drain electrode 116 and a source electrode 117. A silicon film having a thickness of 10 to 150 nm is formed as the semiconductor film 110, and a nitride film having a thickness of 20 to 300 nm is formed as the gate insulating film 111. A laminate film including a tantalum nitride film having a thickness of 30 to 60 nm and a tungsten film having a thickness of 370 to 400 nm is formed as each of the gate electrodes 112 and 113. A silicon oxide film having a thickness of 50 to 150 nm is formed as the first interlayer insulating film 114, whereas an acrylic resin film having a thickness of 1 to 3 μm is formed as the second interlayer insulating film 115. As each of the drain electrode 116 and the source electrode 117, a laminate including a titanium film having a thickness of 50 to 800 nm, an aluminum alloy film containing aluminum as a main constituent, to which silicon is added as an impurity element, having a thickness of 350 to 400 nm, and a titanium film having a thickness of 100 to 1600 nm, is formed. A conductor film 123, a wiring 122 and a wiring 124 are formed of the same layer as the drain electrode 116 and the source electrode 117.

As an anode, the first electrode 103 made of an ITO (Indium Tin Oxide) film, which is a conductive film having light transmittance, is formed. The first electrode 103 may be formed to have a thickness of 100 to 200 nm.

A bank made of a photosensitive organic resin film such as acrylic or polyimide is formed so as to partially overlap the end of the first electrode 103. A thickness of the bank is set to 1 to 10 μm. A photosensitive acrylic resin film is patterned to form a first insulating film 107 in a striped manner along a source wiring as the bank. A second insulating film 108 is formed so as to cover the peripheral area of the first substrate 100 and the driving circuit portion 120.

The formation of an organic compound film 104 in a striped manner along a gentle slope of the bank prevents the breaking of the organic compound film 104 at the end of the first electrode 103, which in turn prevents the short-circuit between the first electrode 103 and the second electrode 105 due to the broken point of the organic compound film 104. The organic compound film 104 is deposited in the order of: electron transport layer/light emitting layer/hole transport layer/hole injection layer. However, the organic compound film 104 may alternatively have a structure of: electron transport layer/light emitting layer/hole transport layer; or electron injection layer/electron transport layer/light emitting layer/hole transport layer/hole injection layer. In the present invention, any conventional structures may be used.

As specific examples of the light emitting layers, the following layers may be used: as a layer emitting red light, cyanopolyphenylene; as a layer emitting green light, polyphenylene vinylene; and as a layer emitting blue light, polyphenylene vinylene or polyalkylphenylene. A thickness of the light emitting layer may be set to 30 to 150 nm.

Since the above-mentioned materials are merely examples of the materials that can be used for the light emitting layers, the materials are not limited thereto. Materials for forming the light emitting layer, the hole transport layer, the hole injection layer, the electron transport layer and the electron injection layer may be freely selected in the possible combinations thereof.

As the second electrode 105, a cathode is made of a material containing magnesium (Mg), lithium, (Li) or calcium (Ca) having a small work function. Preferably, an electrode made of MgAg (a material obtained by mixing Mg and Ag at the ratio of Mg:Ag=10:1) may be used. Besides, an MgAgAl electrode, an LiAl electrode, and an LiFAl electrode can be cited as examples of the second electrode 105. The second electrode 105 is formed by using a material such as MgAg or LiF. A thickness of the second electrode 105 may be set to 100 to 200 nm. The second electrode 105 is formed in a striped manner between the banks, serving as a common electrode which is short-circuited outside the display area.

The organic light-emitting element 106 is formed by depositing the first electrode 103, the organic compound film 104, and the second electrode 105 in this order. The first electrode 103 serves as a cathode having light reflectance, whereas the second electrode 105 serves as an anode having light transmittance, thereby allowing light emitted from the organic light-emitting element 106 to be output toward the side of the first substrate 100.

As a protective film 109, a DLC film having a thickness of 100 to 500 nm is used. The DLC film can be formed by a plasma CVD method, a microwave CVD method, an electron cyclotron resonance (ECR) CVD method, a sputtering method or the like. With any film formation method, the DLC film having good adhesion can be formed without heating the organic compound film. The DLC film is formed with the substrate being placed on the cathode. Alternatively, a negative bias is applied onto the substrate to form a fine and hard DLC film by utilizing the ion impact to some extent. As a reaction gas used for film growth, a hydrocarbon type gas, for example, $CH_4$, $C_2H_2$, $C_6H_6$ or the like is used. The reaction gas is ionized by glow discharge. The resulting ions are accelerated to collide against the cathode, across which a negative self-bias is applied, thereby forming the DLC film. In this method, a fine and smooth DLC film can be obtained. Since the substrate is scarcely heated to form the DLC film, the DLC film can be formed in the last manufacturing step of the first substrate 100. The DLC film is provided so as to cover the second electrode 105, the first insulating film 107 and the second insulating film 108.

As the adhesive 102, an epoxy type adhesive is used. Either an ultraviolet-curable resin or a heat-curable resin can be used as the adhesive 102. It is preferred to select a material for the adhesive 102 in consideration of a heat resistance temperature of the organic light-emitting element 106. It is desired that the adhesive 102 is formed as thin as possible. As the adhesive 102, LIXON BOND, LX-0001 distributed by Tisso Co. Ltd. may be used. The lixon bond, LX-0001, is a two-part epoxy resin. After the application of LX-0001 on the first substrate 100, LX-0001 is cured at 100° C. for two hours, applying the stress on the periphery of the first substrate 100 and the second substrate 101. After the curing, the adhesive 102 can be formed to have a thickness of 0.2 to 0.5 μm by adjusting the stress and the amount of application. In Embodiment Mode 1, the distance between the first substrate 100 and the second substrate 101 is controlled by the total thickness of the base films 118 and 119, the gate insulating film 111, the first interlayer insulating film 114, the second interlayer insulating film 115, the wiring 122 or the conductor film 123, the second insulating film 108 and the adhesive 102. In this laminate structure, the adhesive 102 is not required to have a function of controlling the gap. Since it is sufficient for the adhesive 102 to have an adhesion function for bonding the substrates to each other, it is preferred that the adhesive 102 is formed as thin as possible so as to reduce the area of the adhesive 102 made of an organic resin material, which is exposed to the outside air on the side faces of the display device.

As the sealing substrate 101, a second substrate made of glass such as barium borosilicate glass, alumino-borosilicate glass, or quartz glass is used.

Although not shown, the stripe-shaped second electrode 105 is short-circuited outside the display area to serve as a common electrode. In the region designated by a chain line B-B', one end of the wiring 124 is in contact with the second electrode 105. The other end of the wiring 124 serves as an external input terminal.

The conductor film 123 below the adhesive 102 is provided to equalize the total thickness of the laminate film below the adhesive 102 so that the distance between the first substrate 100 and the second substrate 101 is uniformed in the region surrounded by the adhesive 102. The conductor film 123 is provided so as to cover the upper face and the side faces of the second interlayer insulating film 115 made of an organic resin film except the region where the external input terminal is provided, thereby preventing water from passing through the side faces of the second interlayer insulating film 115 to enter the inside of the display device.

Although not shown, the surface of the sealing substrate 101 may be scraped off by a sandblast method so that a desiccant is bonded to the scraped region by an adhesive.

Since the organic compound film and the second electrode 105 of the organic light-emitting element 106 are provided along the side faces of the first insulating film 107, the laminate film constituting the light-emitting element 106 is not broken even if the stress is externally applied onto the second substrate 101. Moreover, since the first insulating film 107 and the second insulating film 108 made of an elastic organic resin film are provided on the TFT in the pixel portion and the TFT in the driving circuit portion, the TFTs in the driving circuit portion and the pixel portion are not damaged even if the stress is externally applied onto the second substrate 101.

A chain line A-A' indicates a cross section of the pixel portion 121 and the peripheral area of the first substrate 100; a chain line B-B' shows a connection structure between the second electrode 105 and the wiring 124 connected to the external input terminal; and a chain line C-C' shows a connection structure between the TFT in the driving circuit portion and the external input terminal.

Figure 6:
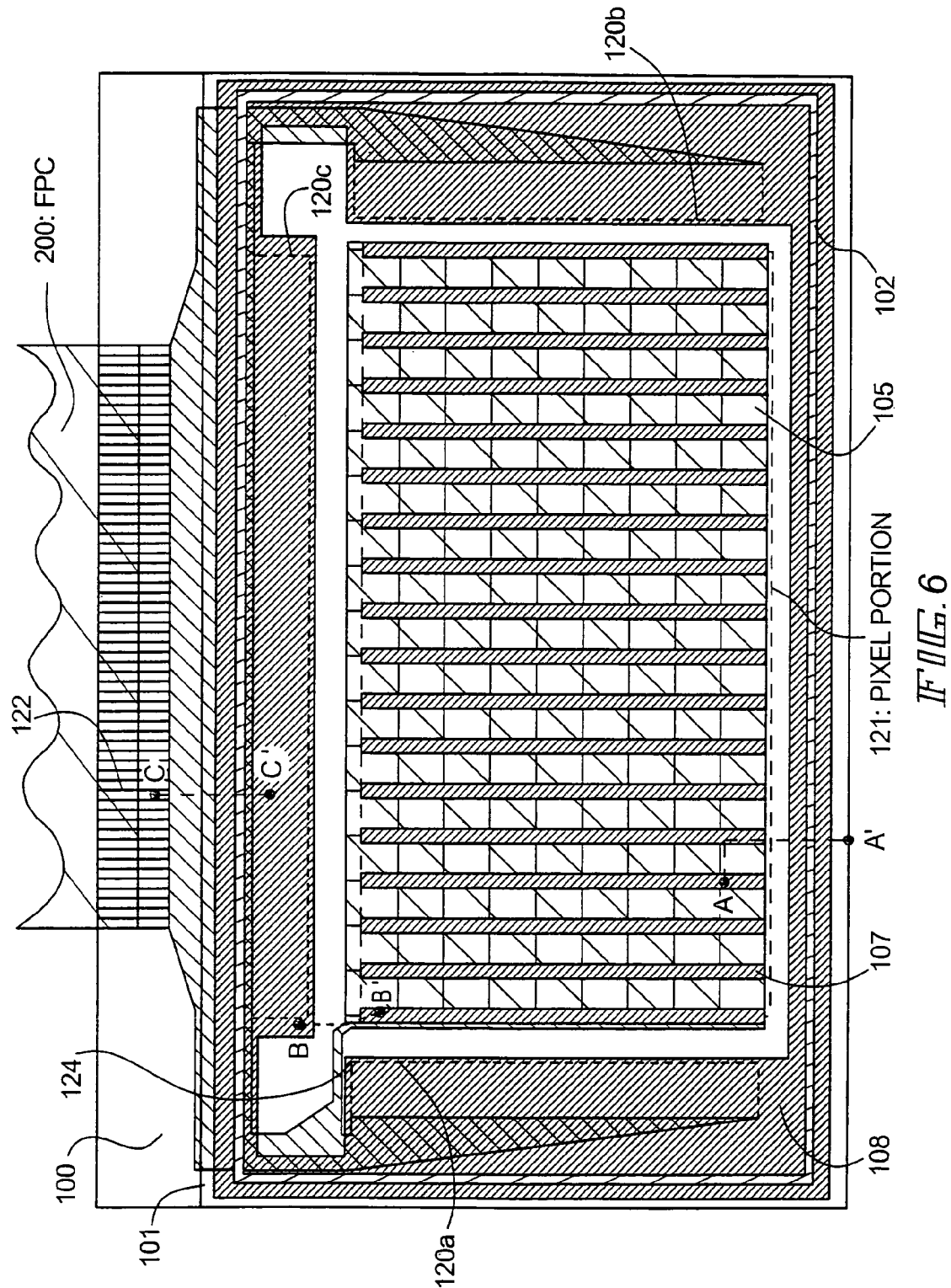
FIG. 6 is a top plan view showing the appearance of a display device using the organic light-emitting element according to Embodiment Mode 1.

FIG. 6 is a top plan view of this embodiment mode. FIG. 6 shows the appearance of a display device using an organic light-emitting element according to the present invention. The cross-sections cut along the chain lines A-A', B-B', and C-C' in FIG. 6 correspond to the chain lines A-A', B-B', and C-C' in FIG. 1, respectively. The same elements as those in FIG. 1 are designated by the same reference numerals in FIG. 6.

The top plan view of FIG. 6 shows the first substrate 100 and the second substrate 101 having light transmittance, which are bonded to each other through the adhesive 102. On the first substrate 100, the pixel portion 121, the driving circuit portion, a flexible printed circuit (FPC) 200, the wirings 122 and 124 serving as external input terminals for attaching the FPC 200 onto the substrate, and the like are formed.

As the driving circuit portion, a first gate wiring side driving circuit portion 120a and a second gate wiring side driving circuit portion 120b are respectively provided on the ends of the gate wiring in the pixel portion so as to be connected to the gate wiring in the pixel portion. A source wiring side driving circuit portion 120c is provided so as to be connected to a source wiring in the pixel portion.

The FPC 200 is bonded to the external input terminal 122 through an anisotropic conductive resin. The first insulating film 107 serving as the bank is provided in a column direction in a striped manner. The second insulating film 108 is provided in a closed curve form in the peripheral area of the first substrate 100 so as to cover the first gate wiring side driving circuit portion 120a, the second gate wiring side driving circuit portion 120b, and the source wiring side driving circuit portion 120c. The second electrode 105, serving as a common electrode, is provided in a striped manner along the first insulating film 107 and is short-circuited outside the pixel portion.

The display device using the organic light-emitting element manufactured as described above can be used as a display section of various electronic appliances.

Embodiment Mode 2

Figure 2:
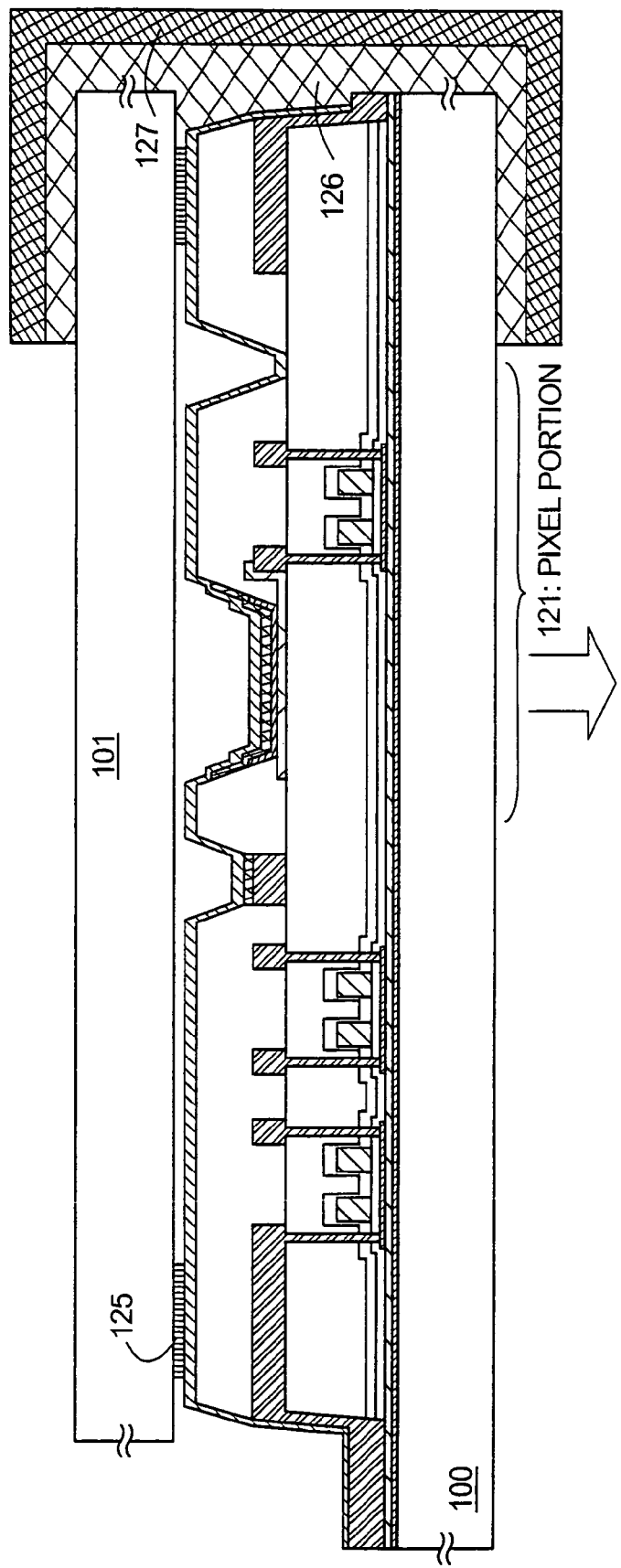
FIG. 2 is a cross-sectional view showing a display device using an organic light-emitting element according to Embodiment Mode 2.

Embodiment Mode 2 will be described with reference to a cross-sectional view of FIG. 2. FIG. 2 is a cross-sectional view showing an active-matrix organic light-emitting element of Embodiment Mode 2. In Embodiment Mode 2, the display device described in Embodiment Mode 1, whose periphery is further covered with an adhesive and a metal plate 127 having a U-shaped cross section so as to prevent water from entering the organic light-emitting element, is described.

With the reference to the top plan view of FIG. 6, the adhesive and the metal plate 127 are placed so as not to overlap the pixel portion 121. In the region where the external input terminal 122 is formed so as to attach the FPC 200 thereto, the side face of the first substrate 100 and the side face of the second substrate 101 are separate from each other by 5 to 20 mm. Therefore, the adhesive and the metal plate 127 are provided in the periphery of the region where the end of the first substrate 100 and the end of the second substrate 101 overlap with each other except the above-mentioned region.

In Embodiment Mode 2, the metal plate 127 is formed to have a U-shape. The metal plate 127 is intentionally omitted on the pixel portion 121, which occupies a dominant area on the external front face of the display device, and the back face of the pixel portion 121. The reason for this is as follows. When the display device is made to be thinner, the strength of the first substrate 100 and the second substrate 101 is correspondingly lowered. In order to prevent the cracking from being generated in the first substrate 100 and the second substrate 101 by a sudden change in the temperature of the environment where the display device is used due to the difference in thermal expansion coefficient of the metal plate 127, the first substrate 100 and the second substrate 101, the overlapping area of the first substrate, the second substrate and the metal substrate is limited.

According to Embodiment Mode 2, a first adhesive 125 for bonding the first substrate 100 and the second substrate 101 to each other and a second adhesive 126 provided between the U-shaped metal plate 127 and the side face of the display device are provided in contact with each other. As a result, the water vapor contained in the outside air is prevented from passing through the side face of the display device to enter the sealed region. Thus, water can be prevented from entering the organic light-emitting element placed in the pixel portion 121, in a low-cost and simple manner.

In Embodiment Mode 2, it is also possible to fill the second adhesive 126 placed between the metal plate 127 and the side face of the display device with a desiccant.

Embodiment Mode 3

Figure 3:
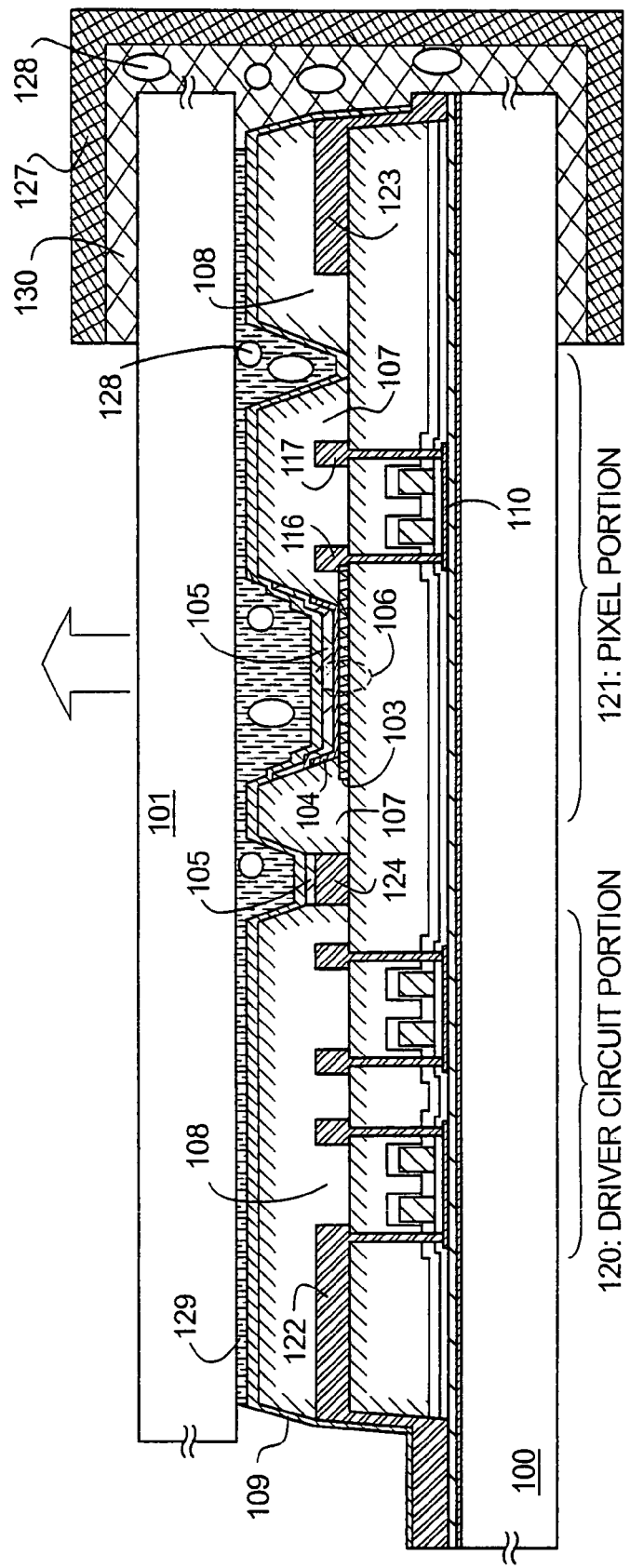
FIG. 3 is a cross-sectional view showing a display device using an organic light-emitting element according to Embodiment Mode 3.

Embodiment Mode 3 will be described with reference to a cross-sectional view of FIG. 3. FIG. 3 is a cross-sectional view showing an active-matrix organic light-emitting element according to Embodiment Mode 3. The differences from Embodiment Mode 1 will be described.

The thicknesses and the materials of the base films, the semiconductor film, the gate insulating film, the gate electrodes, and the first interlayer insulating film are the same as those in Embodiment Mode 1.

In Embodiment Mode 3, the second interlayer insulating film 115 formed of an organic resin film is thermally cured at 200 to 300° C. A resist is formed on the upper face of the second interlayer insulating film 115, and is then etched by using a reactive gas. After formation of a contact hole reaching the semiconductor film 110, the resist is removed. The surface of the second interlayer insulating film 115 is treated with a plasma using argon or nitrogen as a reactive gas. The reactive gas causes the molecular dissociation by plasma discharge decomposition to generate excited molecules, radicals and ions to be reacted with the second interlayer insulating film 115. As a result, the quality of the surface of the second interlayer insulating film 115 is improved to refine its surface. As the second interlayer insulating film 115, any one of an acrylic resin film, a polyimide resin film, and a polyamide resin film may be used. In this embodiment mode, an acrylic resin film is used.

The first electrode 103 is provided on the second interlayer insulating film 115 as a cathode of the organic light-emitting element. The cathode may be made of a known material such as MgAg or AlLi to have a thickness of 100 nm to 200 nm. Since the surface of the second interlayer insulating film 115 is refined, an impurity contained in the second interlayer insulating film 115 is prevented from being diffused to the first electrode 103 serving as the cathode of the organic light-emitting element.

Next, the drain electrode 116 is formed to have a thickness of 400 nm so as to overlap the end of the first electrode 103. The source electrode 117, the conductor film 123 and the wirings 122 and 124 are formed of the same layer as the drain electrode 116.

Next, an insulating film made of an organic material is formed to have a thickness of 1 to 10 μm, and is patterned to form the first insulating film 107 and the second insulating film 108. In this embodiment mode, a photosensitive acrylic resin film having a thickness of 3 μm is used as the insulating film. The first insulating film 107 made of an organic resin is provided in a striped manner as a bank so as to cover the end of the first electrode 103. The second insulating film 108 is provided in the peripheral area of the first substrate 100. The first insulating film 107 and the second insulating film 108 are treated with a plasma, using argon or nitrogen as a reactive gas, thereby forming a fine and hard film on the surface of each insulating film.

Next, the organic compound film 104 is provided on the first electrode 103. A known material may be used for the organic compound film 104. Next, the second electrode 105 formed of a transparent conductive film is provided on the organic compound film 104 as an anode. An ITO film may be used for the anode. The deposition of the first electrode, the organic compound film and the second electrode completes the organic light-emitting element 106.

Then, a DLC film having a thickness of 100 nm is provided as the protective film 109 so as to cover the second electrode, the first insulating film and the second insulating film of the organic light-emitting element 106.

Moreover, a gap between the first substrate 100 and the second substrate 101 is filled with a first adhesive 129, whereby water and oxygen contained in the outside air can be prevented from entering the organic light-emitting element 106 through the side faces of the display device. Since the first adhesive 129 used in this embodiment mode is also provided above the organic light-emitting element 106, it is necessary to sufficiently conduct the degassing and dehydration under vacuum. The first adhesive 129 is provided above the first substrate 100, and the second substrate 101 is provided so as to be opposed to the first substrate 100. Then, the stress is applied under vacuum so as to press the two substrates 100 and 101 against one another, thereby curing the first adhesive 129. In the step of forming the layers from the base films to the protective film, even if the thickness of the laminate film in the driving circuit portion, the pixel portion and the peripheral area of the first substrate 100 slightly differs, the difference in thickness is absorbed by the adhesive 129 by providing the adhesive 129 on the laminate film.

Since the first adhesive 129 used in this embodiment mode is provided even above the organic light-emitting element, it is necessary to sufficiently conduct the degassing and dehydration under vacuum. A desiccant 128 in a granular form is dispersed in the first adhesive 129. The finely ground desiccant, i.e., having a diameter of 1.0 μm or less, preferably, 0.2 μm or less, more preferably, 0.1 μm or less, is used so as not to generate the unevenness in the gap between the first substrate 100 and the second substrate 101. As the desiccant 128, calcium oxide, barium oxide or the like may be used. Since the desiccant 128 is provided in the proximity of the organic light-emitting element 106, the concentration of water in the vicinity of the organic light-emitting element can be lowered to prolong the lifetime of the display device.

In the case where light emitted from the organic light-emitting element 106 is to be obtained from the side of the sealing substrate (second substrate) 101, it is preferred to use barium oxide, which has a higher transparence than that of calcium oxide.

Next, in the same manner as Embodiment Mode 2, a second adhesive 130 is provided between the U-shaped metal plate 127 and the side faces of the display device so as to prevent water from passing through the side faces of the display device. This embodiment mode differs from Embodiment Mode 2 in that the desiccant 128 is also dispersed in the second adhesive 130. Before entering the sealed region between the element substrate and the sealing substrate, water contained in the outside air is captured by the hygroscopic desiccant 128 dispersed in the second adhesive 130. As a result, the lifetime of the display device can be intended to be prolonged. For example, dark spots due to the reaction between the cathode of the organic light-emitting element and water can be prevented from being generated.

In this embodiment mode, since a fine film is formed on the second insulating film 108, water passing through the protective film 109 can be prevented from further passing through the side faces of the second insulating film 108 to enter the organic light-emitting element.

In Embodiment Mode 3, since the anode formed of a transparent conductive film is on the side of the second substrate 101 whereas the cathode having light reflectance is on the side of the first substrate 100, light emitted from the organic light-emitting element 106 can be output from the side of the second substrate 101 made of glass. The light emitted from the organic light-emitting element 106 is externally obtained from second substrate 101 through the adhesive. Therefore, the obtained light appears as interference fringes if the gap between the first substrate and the second substrate in the pixel portion is not uniform. If the distance between the substrates in the pixel portion differs from that in the peripheral area of the first substrate, the distance between the substrates gradually varies from the peripheral area to the pixel portion to generate the interference fringes in the pixel portion. Thus, in order to uniform the distance between the substrates in the pixel portion, it is necessary to equalize the distance between the substrates in the peripheral area of the first substrate with that in the pixel portion. According to the present invention, even if the total thickness of the laminate layer on the first substrate 100 slightly varies in the pixel portion, the driving circuit portion, and the peripheral area of the first substrate, the variation in thickness of the laminate film is absorbed by the first adhesive. As a result, the distance between the first substrate and the second substrate can be made uniform throughout the peripheral area of the first substrate, the driving circuit portion, and the pixel portion.

Embodiment Mode 4

Figure 4:
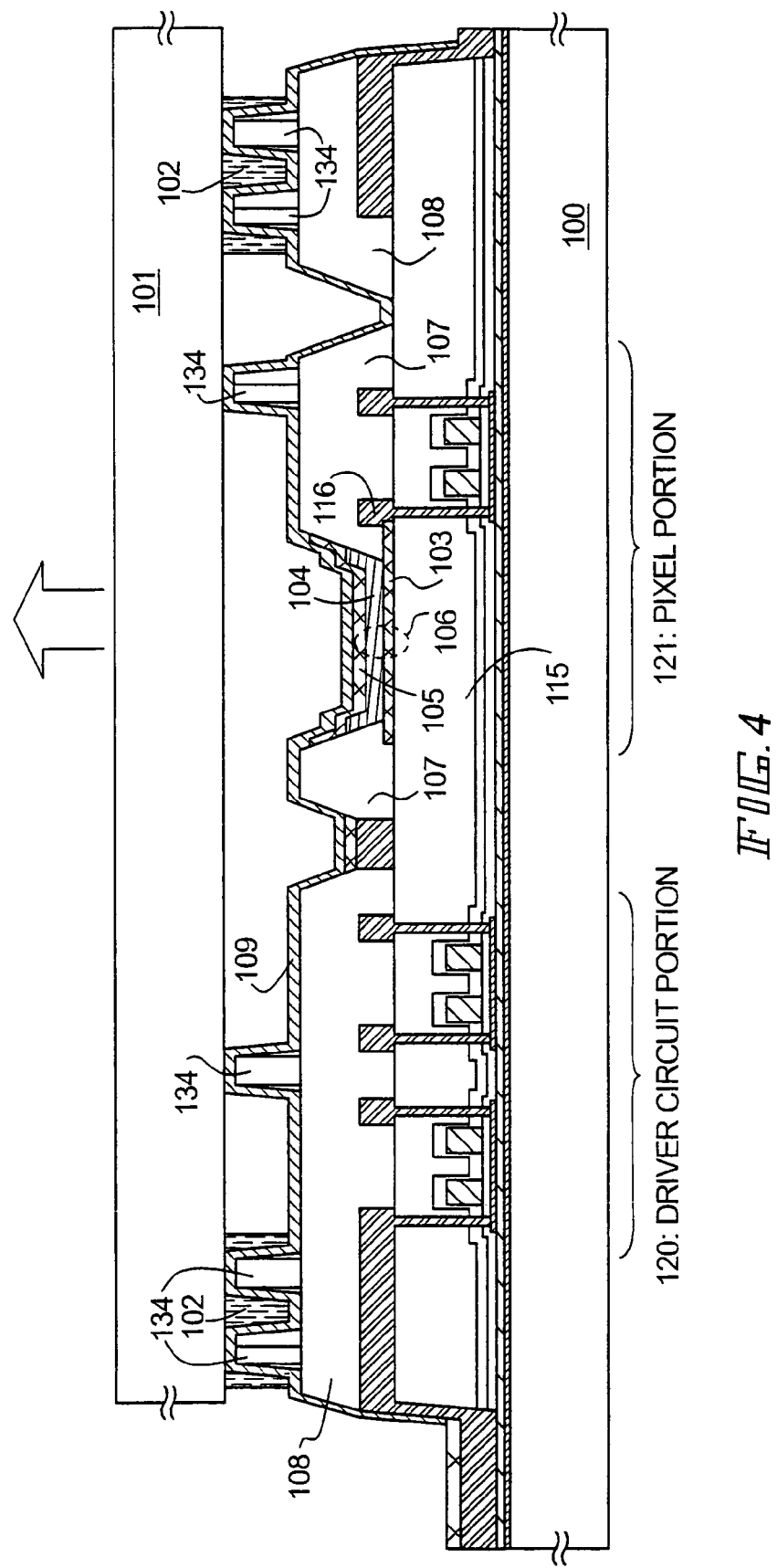
FIG. 4 is a cross-sectional view showing a display device using an organic light-emitting element according to Embodiment Mode 4.

Embodiment Mode 4 will be described with reference to a cross-sectional view of FIG. 4. FIG. 4 is a cross-sectional view showing an active matrix organic light-emitting element according to Embodiment Mode 4.

The thicknesses and the materials of the base films, the semiconductor film, the gate insulating film, the gate electrodes, the first interlayer insulating film, and the second interlayer insulating film are the same as those in Embodiment Mode 1.

The drain electrode 116 is formed so as to overlap the end of the first electrode 103. Then, a photosensitive polyimide resin film having a thickness of 2.0 µm is formed and patterned into the first insulating film 107 and the second insulating film 108. The first insulating film 107 made of an organic resin is provided in a striped manner as a bank so as to cover the end of the first electrode 103. The second insulating film 108 is provided in the peripheral area of the first substrate 100.

Next, a photosensitive organic resin film is formed to have a thickness of 0.1 to 10 µm. Then the photosensitive organic resin film is patterned and cured at 200 to 300° C. to form a convex-shaped third insulating film 134 as a spacer on the upper surface of the bank (first insulating film). A polyimide resin film or an acrylic resin film can be used as the photosensitive organic resin film; in this embodiment mode, an acrylic resin film is used. In this embodiment mode, spacers are also formed on the upper face of the second insulating film 108, for example, in the driving circuit portion 120 and the peripheral area of the first substrate 100. The spacer provided in the peripheral area of the first substrate 100 is formed to have a closed curve form.

Next, the organic compound film 104 is provided on the first electrode 103. A known material may be used for the organic compound film 104. Next, the second electrode 105 formed of a transparent conductive film is provided on the organic compound film 104 as an anode. An ITO film may be used for the anode.

Then, the protective film 109 formed of a DLC film having a thickness of 80 nm is provided so as to cover the anode, the bank, the second insulating film, and the spacers of the organic light-emitting element. The protective film 109, which serves to prevent water from entering inside, is formed on the side faces of the spacer. Thus, if a plurality of spacers having a closed curve form are provided in the peripheral area of the first substrate 100, water passing through the side faces of the display device is blocked for a plurality of times by the protective film 109 provided on the side faces of the spacers. As a result, the amount of water entering the display device through its side faces can be reduced.

Next, the adhesive 102 is provided in the peripheral area of the first substrate 100. A gap between the spacer having a closed curve form provided in the peripheral area of the first substrate 100 and another spacer having a closed curve form provided inside the aforementioned spacer is filled with the adhesive 102. The second substrate 101 made of glass, which is used as the sealing substrate, is bonded to the element substrate 100 through the adhesive 102.

In this embodiment mode, since the anode formed of a transparent conductive film is on the side of the second substrate 101 whereas the cathode having light reflectance is on the side of the first substrate 100, light emitted from the organic light-emitting element can be output from the side of the second substrate 101 made of glass. When the light emitted from the organic light-emitting element is output from the side of the second substrate 101, the obtained light appears as interference fringes to degrade the display quality if the gap between the first substrate and the second substrate in the pixel portion is not uniform. With the spacers being placed in the pixel portion, the driving circuit portion and the peripheral area as described in this embodiment mode, the uniformity of the gap between the first substrate and the second substrate is improved to enable the manufacturing of a display device with good display quality.

Figure 7:
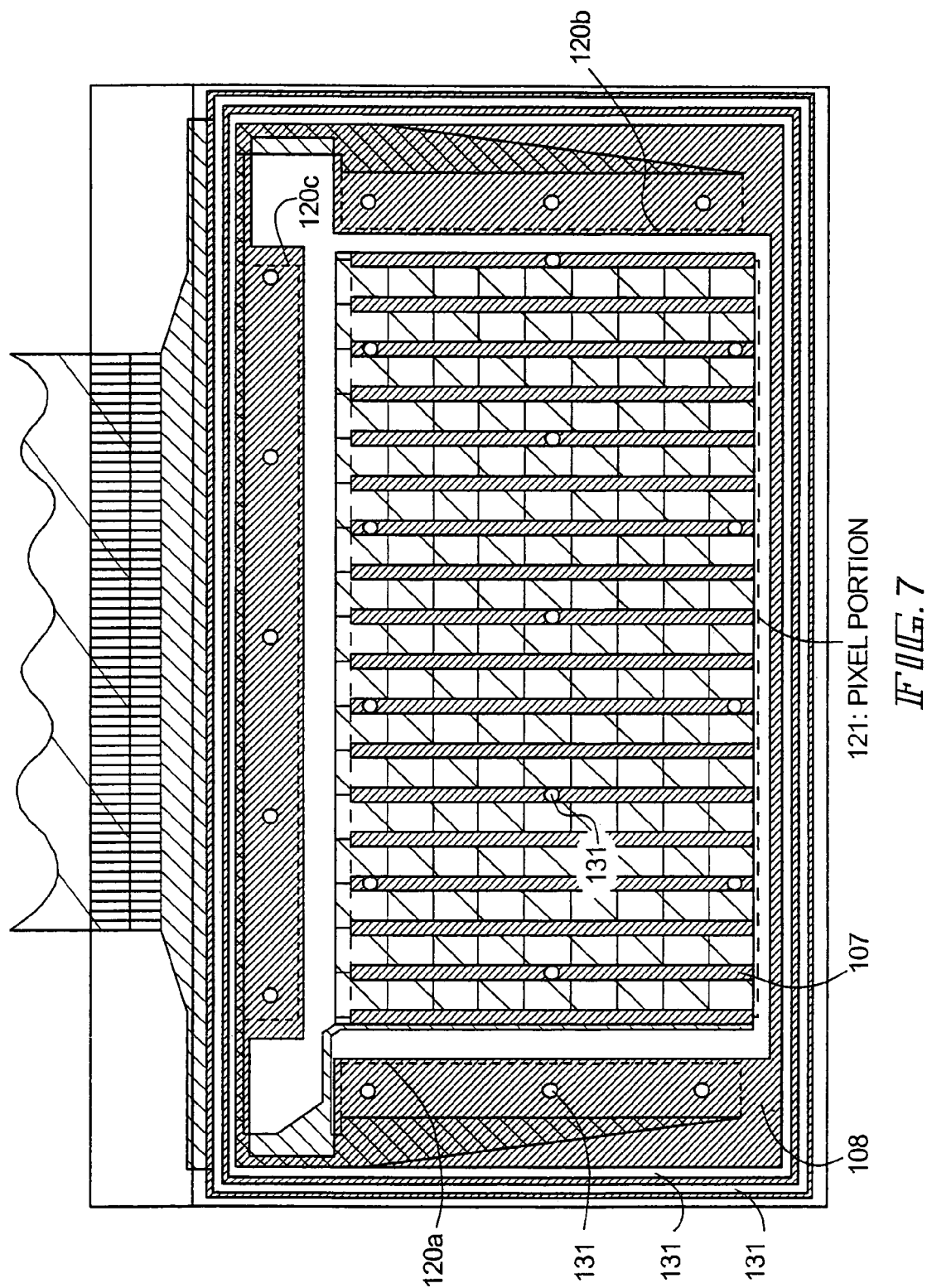
FIG. 7 is a top plan view showing the appearance of a display device using the organic light-emitting element according to Embodiment Mode 4.

FIG. 7 is a top plan view of this embodiment mode. FIG. 7 shows the arrangement of convex-shaped third insulating films 131 serving as spacers in this embodiment mode. On the first insulating film 107 in the pixel portion 121, the spacers having a circular cross section are placed at equal intervals in the horizontal and vertical directions of the pixel portion 121. The spacers having a circular cross section are placed at equal intervals on the second insulating film 108 situated above the first gate wiring side driving circuit portion 120a, the second gate wiring side driving circuit portion 120b and the source wiring side driving circuit 120c. In the peripheral area of the first substrate 100, the spacers 131 are placed in a closed curve form on the second insulating film 108. In FIG. 7, the spacers 131 having a closed curve form are formed in a double line. However, the spacers 131 can be formed in a triple or quadruple line; it can be appropriately designed by the designer.

Although not shown, the surface of the sealing substrate or the element substrate may be scraped off by using a sandblast method to form a convex portion where the desiccant is to be placed. It is also possible to place an adhesive in the convex portion so as to fix the desiccant thereto. In this way, the desiccant is fixed through the adhesive to prevent the desiccant from moving.

Embodiment Mode 5

Figure 5:
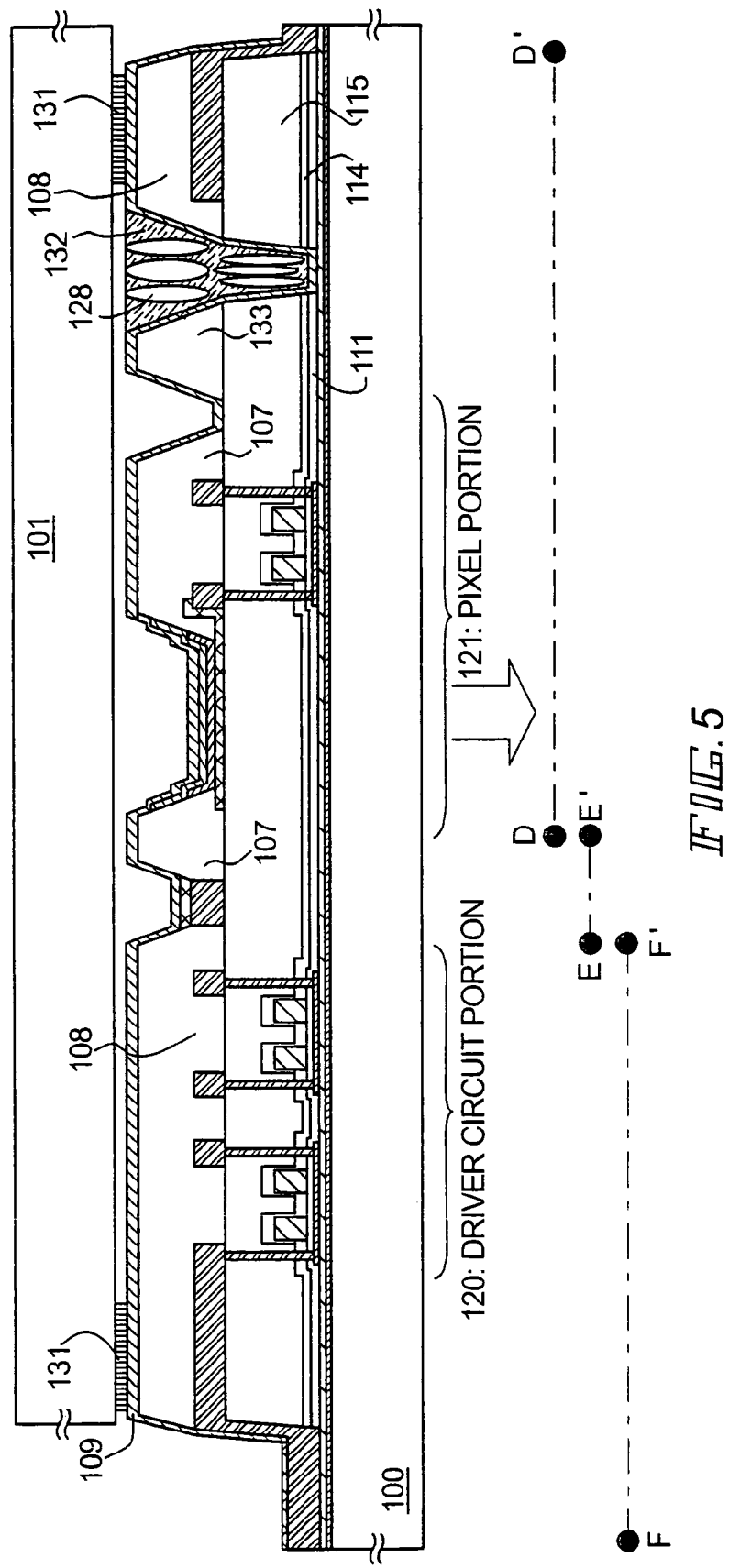
FIG. 5 is a cross-sectional view showing a display device using an organic light-emitting element according to Embodiment Mode 5.

Embodiment Mode 5 will be described with reference to a cross-sectional view of FIG. 5. FIG. 5 is a cross-sectional view showing an active matrix organic light-emitting element of Embodiment Mode 5.

In Embodiment Mode 5, the gate insulating film 111, the first interlayer insulating film 114, the second interlayer insulating film 115 and the insulating films are etched to form an opening. It is preferred to set a depth of the opening to 3 to 15 µm. After formation of the protective film 109 as the uppermost layer of the first substrate 100, the second adhesive 132, in which the desiccant 128 is dispersed, is provided in the opening covered with the protective film 109. As the desiccant 128, calcium oxide or barium oxide can be used; in this embodiment mode, barium oxide is used. A syringe is filled with the second adhesive 132, in which the granular desiccant 128 having a diameter of 0.3 to 1.0 µm is dispersed, by a known dispenser system. A gas pressure of a predetermined value is applied onto the upper end of the syringe so that the adhesive 132 and the desiccant 128 are ejected through a narrow nozzle on the lower end of the syringe toward the opening. The second adhesive 132 are fully subjected to degassing and dehydration before use.

Next, the first adhesive 131 is applied onto the peripheral area of the first substrate 100 by a known dispenser system, so that the first substrate 100 and the second substrate 101 are bonded to each other under dry air. As dry air, nitrogen or argon, which is an inert gas, is used.

In this embodiment mode, the insulating films such as the second interlayer insulating film and the second insulating film are patterned to provide a region where the desiccant is to be placed. Since water passing from the side faces of the display device through the adhesive is captured by the hygroscopic desiccant 128 before reaching the organic light-emitting element, it is possible to prevent the generation of dark spots due to the reaction between water and the cathode of the organic light-emitting element and the peeling of the cathode and the organic compound film.

In this embodiment mode, the insulating film formed of a photosensitive organic resin film is patterned to simultaneously form the first insulating film (bank) 107, the second insulating film 108 provided in the peripheral area of the first substrate 100, and a third insulating film 133 branching off from the second insulating film 108.

Figure 8:
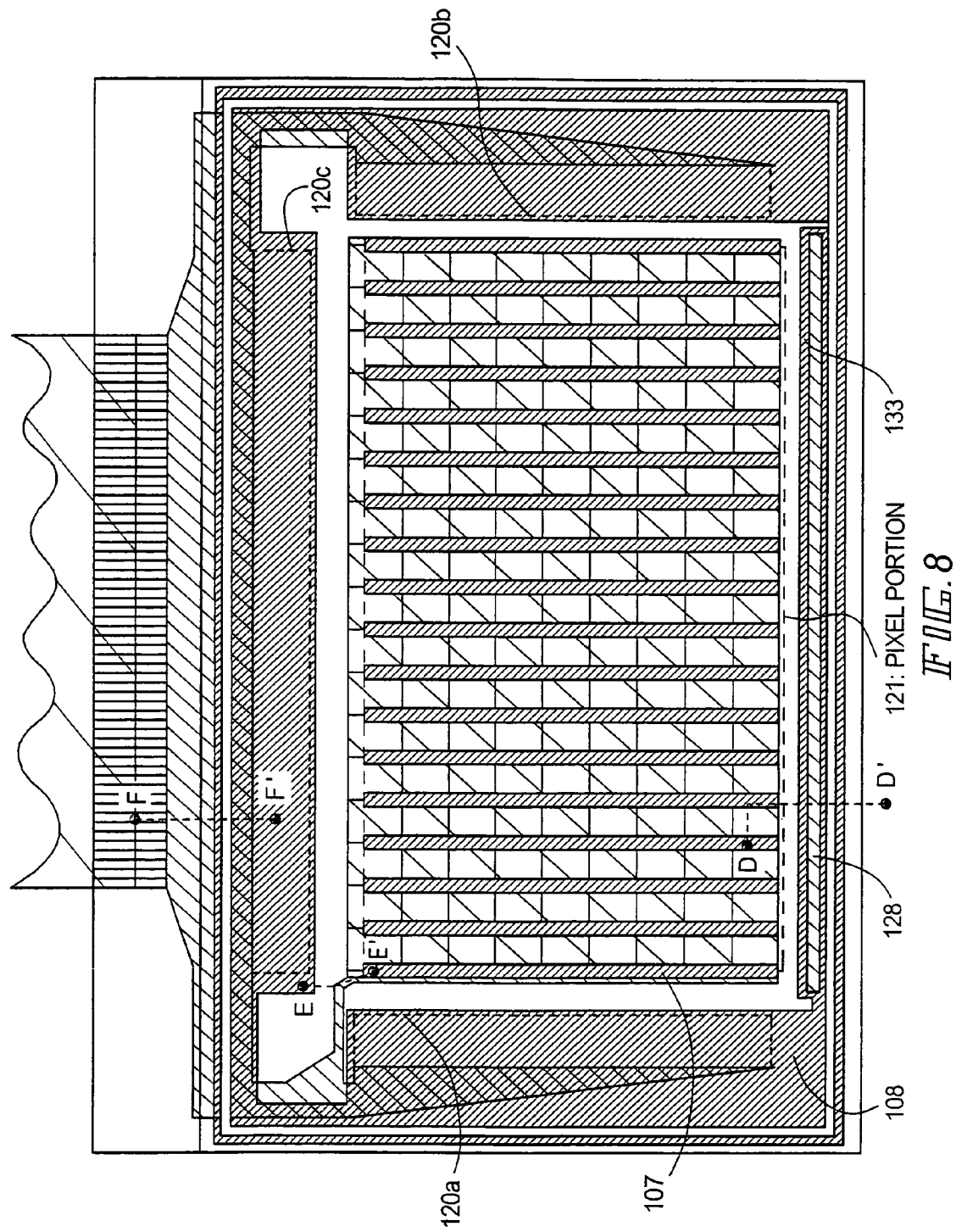
FIG. 8 is a top plan view showing the appearance of a display device using the organic light-emitting element according to Embodiment Mode 5.

FIG. 8 is a top plan view of Embodiment Mode 5. The insulating film formed of a photosensitive organic resin film is patterned to form the first insulating film 107, the second insulating film 108, and the third insulating film 133. The first insulating film 107 is formed in a striped manner in the pixel portion 121 on the first substrate 100. In the peripheral area of the first substrate 100, the second insulating film 108 is formed in a closed curve form so as to cover the first gate wiring side driving circuit portion 120a, the second gate wiring side driving circuit portion 120b, and the source wiring side driving circuit portion 120c. The third insulating film 133 branches off from the second insulating film 108. The desiccant 128 is provided in the gap between the third insulating film 133 and the second insulating film 108. Since the desiccant 128 is fixed through the adhesive, the desiccant 128 can be prevented from moving. The cross-sections cut along the chain lines D-D, E-E' and F-F' in the top plan view of FIG. 8 are shown in FIG. 5. The same elements as those in FIG. 5 are designated by the same reference numerals in FIG. 8.

EMBODIMENTS

Embodiment 1

Figure 10:
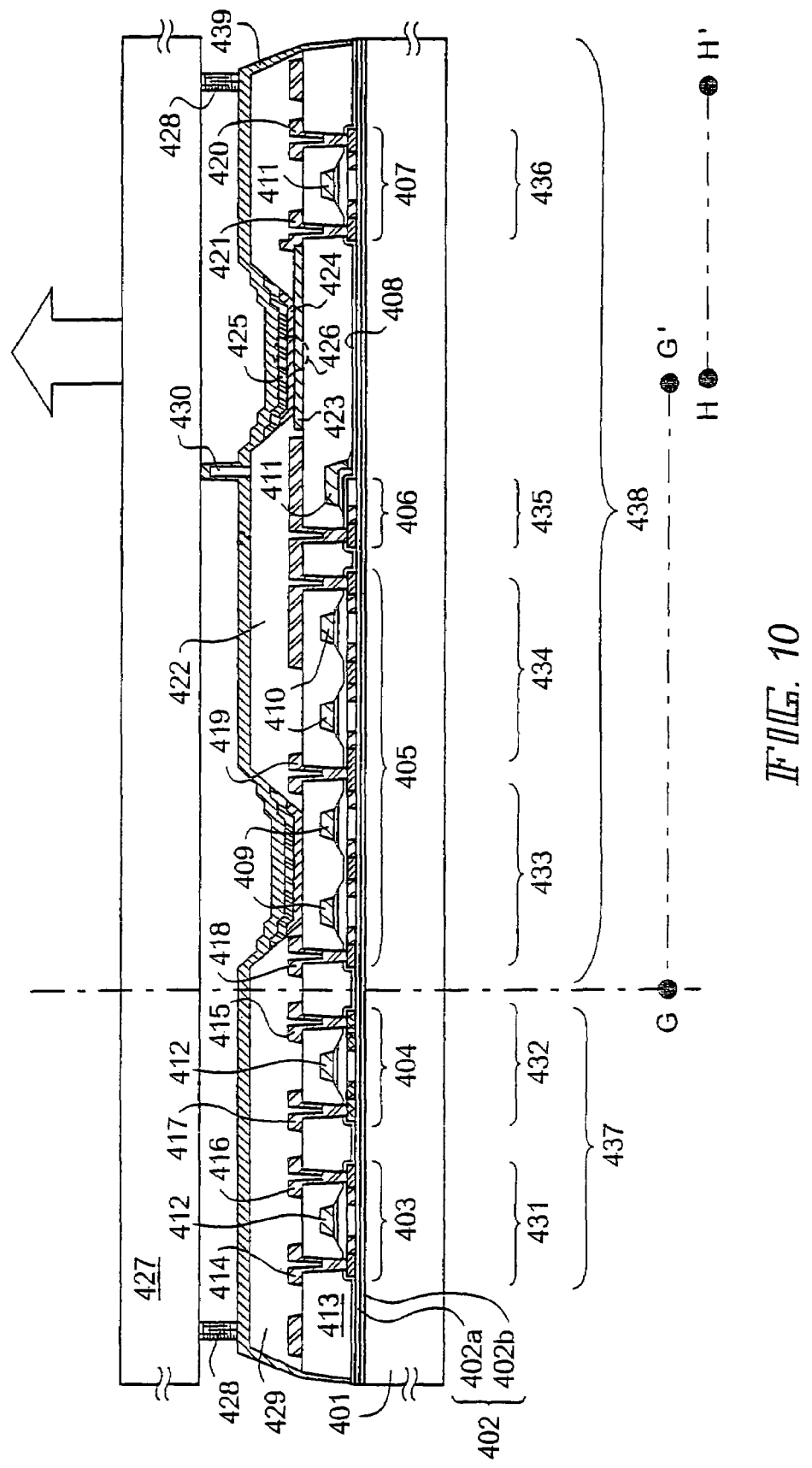
FIG. 10 is a cross-sectional view of an active matrix substrate of Embodiment 1.

The present invention is applicable to any display devices using the organic light-emitting element. FIG. 10 shows an example of such display devices, illustrating an active-matrix display device manufactured by using TFTs. The TFTs in Embodiments are sometimes classified into amorphous silicon TFTs and polysilicon TFTs, depending on the material of a semiconductor film forming a channel formation region. The present invention is applicable to either of them if the channel formation region has a sufficiently high mobility.

An n-channel type TFT 431 and a p-channel type TFT 432 are formed in a driving circuit portion 437. A TFT 433 for switching, a TFT 434 for reset, a TFT 436 for current control and a storage capacitor 435 are formed in a pixel portion 438.

As a substrate 401, a substrate made of glass such as quartz, barium borosilicate glass as is represented by #7059 glass and #1737 glass manufactured by Corning Inc., or alumino borosilicate glass, is used.

Next, a base film 402 formed of a silicon oxide film, a silicon nitride film or a silicon nitride oxide film is provided. For example, a silicon nitride oxide film 402a made of $SiH_4$, $NH_3$ and $N_2O$ is formed to have a thickness of 10 to 200 nm (preferably, 50 to 100 nm) by a plasma CVD method. In the same manner, a silicon nitride oxide film 402b made of $SiH_4$ and $N_2O$ is deposited thereon to have a thickness of 50 to 200 nm (preferably, 100 to 150 nm). Although the base film 402 is shown as a double-layered structure, the base film 402 may be formed as a single-layer film of the above-described insulating film or a multi-layered structure including two or more layers.

Next, island-like semiconductor layers 403 to 407, a gate insulating film 408, and gate electrodes 409 to 412 are formed. Each of the island-like semiconductor layers 403 to 407 has a thickness of 10 to 150 nm, the gate insulating film has a thickness of 50 to 200 nm, and each of the gate electrodes has a thickness of 50 to 800 nm.

Next, an interlayer insulating film 413 consisting of an insulating film made of an inorganic material such as silicon nitride or silicon nitride oxide and an insulating film made of an organic material such as acrylic or polyimide is formed. A thickness of the interlayer insulating film 413 may be set to 1 to 3 μm. The insulating film made of an organic material is desired to have a sufficient thickness to level the unevenness produced due to the island-like semiconductor films 403 to 407 and the gate electrode 409 to 412.

Next, a cathode 423 of the organic light-emitting element is formed. For the cathode 423, a material such as MgAg or LiF may be used. A thickness of the cathode 423 may be set to 100 to 200 nm.

Subsequently, a conductive film containing aluminum as a main component is formed to have a thickness of 1 to 5 μm and then is etched. As a result, a data wiring 418, a drain side wiring 419, a power supply wiring 420 and a drain side electrode 421 are formed in the pixel portion. The data wiring 418 is connected to the source side of the TFT 433 for switching while, although not shown, the drain side wiring 419 connected to the drain side of the TFT 433 for switching is connected to the gate electrode 411 of the TFT 436 for current control. The source side of the TFT 436 for current control is connected with the power supply wiring 420. The drain side electrode 421 is provided so as to connect the drain side of the TFT 436 for current control with the cathode 423. In the driving circuit portion 437, the wirings 414 and 416 are connected to the island-like semiconductor film 403 of the n-channel type TFT 431, whereas the wirings 415 and 417 are connected to the island-like semiconductor film 404 of the p-channel type TFT 432.

Next, a photosensitive acrylic resin film is formed to have a thickness of 1 to 10 μm, and then is etched. As a result, a bank formed of the first insulating film is formed in the pixel portion 438 so as to cover the wirings 414 to 417. The bank is formed so as to cover the end of the cathode 423, thereby preventing the cathode 423 and the anode 425 from short-circuiting in this portion. A second insulating film 429 is formed in the driving circuit portion 437 and the peripheral area of the substrate 401.

Then, an organic resin film such as an acrylic resin film is patterned to form a column-like spacer 430 at a desired position for maintaining the distance between the substrates. In this embodiment, a column-like spacer having a height of 1 μm is provided in the pixel portion 438.

Next, an organic compound film 424 of the organic light-emitting element is formed. The organic compound film 424 is formed to have a single-layered or a multi-layered structure; a higher luminous efficiency can be obtained with a multi-layered structure. Generally, the organic compound film 424 is deposited on the anode 425 in the order of: hole injection layer/hole transport layer/light emitting layer/electron transport layer. However, the organic compound film 424 may have a structure of: hole transport layer/light emitting layer/electron transport layer; or hole injection layer/hole transport layer/light emitting layer/electron transport layer/ electron injection layer. In the present invention, any conventional structures may be used.

In Embodiment 1, color display is performed by vapor-deposition of three light emitting layers corresponding to RGB. As specific examples of light emitting layers, the following may be used as the respective layers: as a layer emitting red light, cyanopolyphenylene; as a layer emitting green light, polyphenylene vinylene; and as a layer emitting blue light, polyphenylene vinylene or polyalkylphenylene. A thickness of the light emitting layer may be set to 30 to 150 nm. The above examples are merely some examples of the organic compounds that can be used as the light emitting layers, and thus the organic compounds are not limited thereto;

The organic compound film described in Embodiment 1 has a laminate structure including a light emitting layer and a hole injection layer made of PEDOT (polythiophen) or PAni (polyaniline).

Next, the anode 425 made of ITO (Indium Tin Oxide) is formed. In the above-described manner, the organic light-emitting element including the cathode made of a material such as MgAg or LiF, the organic compound film formed by the laminate of the light emitting layer and the hole transport layer, and the anode made of ITO is provided. By using a transparent electrode as the anode; light can be emitted in the direction indicated by the arrow in FIG. 10.

A DLC film 439 is formed on the entire surface area of the first substrate 401 so as to prevent water vapor or oxygen from passing through the sealed portion to deteriorate the organic light-emitting element. The DLC film 439 is formed on the entire surface except the external input terminal. When the DLC film is to be formed, the external input terminal may be covered with a masking tape or a shadow mask in advance.

An adhesive is applied onto the second insulating film 429, so that the second substrate having light transmittance is bonded to the first substrate under vacuum. Since the thickness of the adhesive is determined by the height of the column-like spacer 430 provided in the pixel portion, the distance between the substrate and the sealing substrate is adjusted so as to be uniform from the pixel portion to the peripheral area of the substrate.

Figure 9:
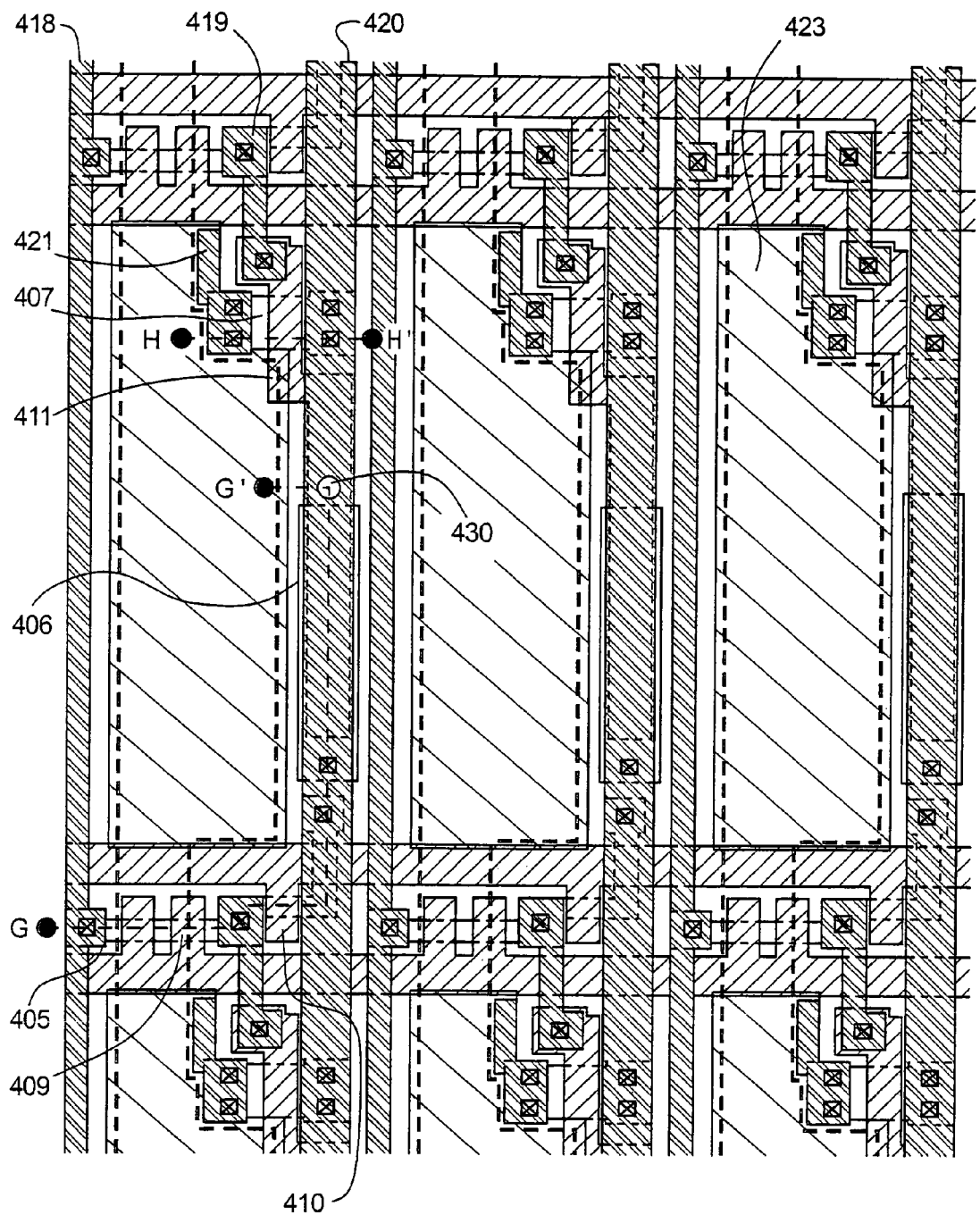
FIG. 9 is a top plan view showing a pixel portion in Embodiment 1.

FIG. 9 is a top plan view of the pixel portion shown in the cross-sectional view of FIG. 10. The same elements as those in FIG. 10 are designated by the same reference numerals in FIG. 9. The cross-sections corresponding to the chain lines G-G' and H-H' in FIG. 9 are shown in FIG. 10. A bank is provided outside the region surrounded by a dot line. Within the region surrounded by the dot line, light emitting layers which emit light of colors corresponding to RGB pixels and an anode are provided. The layout of the pixel portion shown in the top plan view of FIG. 9 is applicable to that of the pixel portion of the display device in Embodiment Mode 4. Moreover, the layout of the pixel portion shown in the top plan view of FIG. 9, from which the column-like spacer is omitted, is applicable to that of the pixel portion of the display device in Embodiment Modes 1 to 4.

Figure 11:
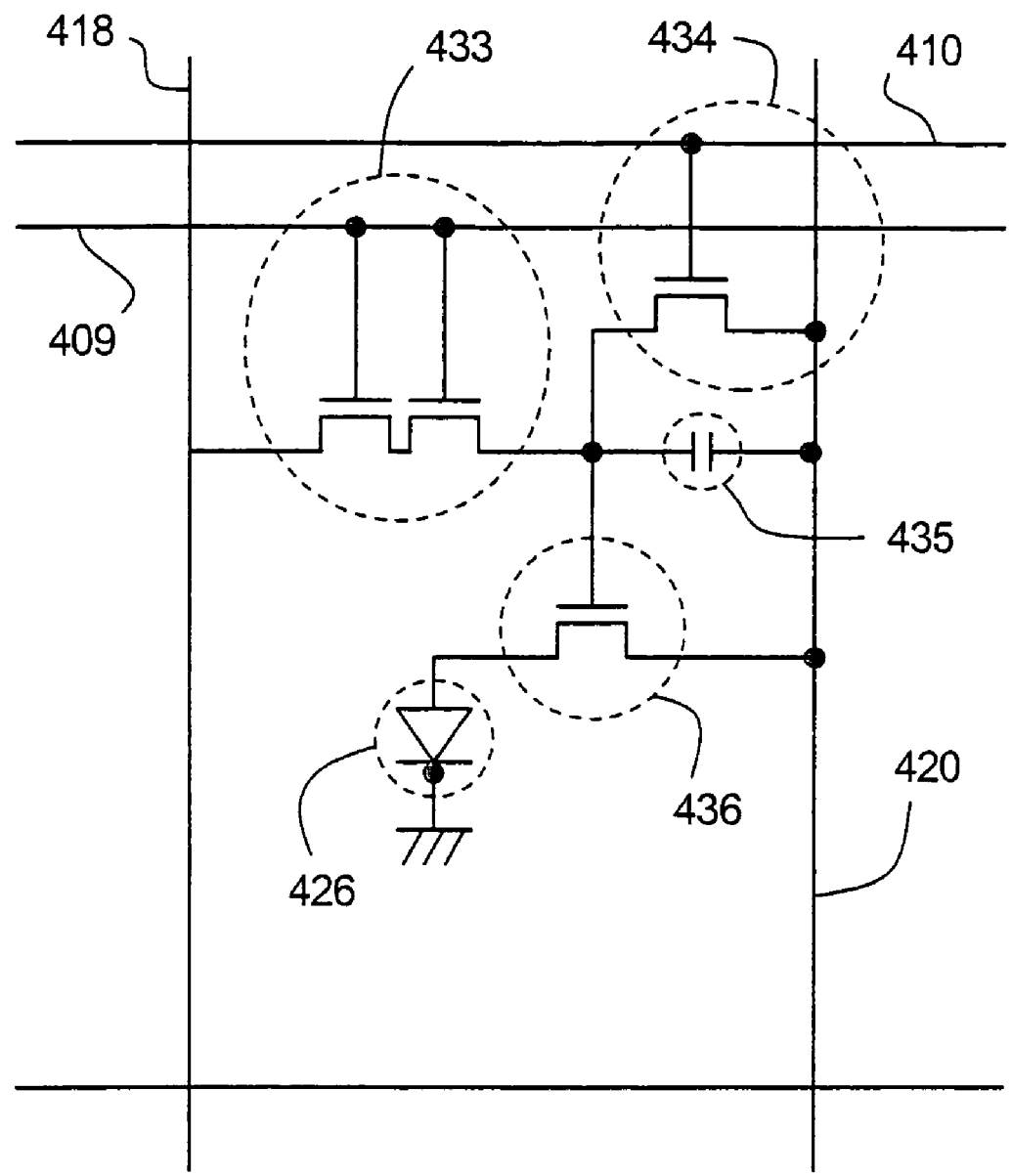
FIG. 11 is an equalizing circuit in the pixel portion of Embodiment 1.

FIG. 11 illustrates an equivalent circuit of such a pixel portion, in which the same elements as those in FIG. 10 are designated by the same reference numerals. The TFT 433 for switching has a multi-gate structure. An LDD overlapping with the gate electrode is provided for the TFT 436 for current control. The TFT using polysilicon demonstrates high operation speed. Accordingly, the deterioration such as hot carrier injection is likely to occur for such a TFT. For this reason, it is very effective to form TFTs having different structures (the TFT for switching having a sufficiently low OFF current and the TFT for current control having resistance against hot carrier injection) depending on their functions in the pixel so as to manufacture the display device with high reliability, capable of performing good image display (having high operation performance).

Even after the TFT 433 for switching in a conductive state is switched to be in a non-conductive state, it is effective to provide a storage capacitor (condenser) 435 so as to obtain the display with high brightness by holding the TFT 436 for current control in a conductive state to maintain the light emitted from the organic light-emitting element.

Furthermore, in a time-division gray-scale system in which gray-scale display is performed by varying the time period of light emission of the organic light-emitting element 426, the TFT 434 for reset is brought into a conductive state so as to switch the organic light-emitting element from a light emission state to a non-light emission state, thereby controlling the time period of light emission of the organic light-emitting element 426.

In Embodiment 1, it is possible to disperse a granular desiccant having a diameter of 0.2 to 0.5 μm in the adhesive. As a result, the amount of water entering the display device through its side faces can be reduced.

Embodiment 2

In Embodiment 2, mother substrates (mother glasses), the area of each mother substrate corresponding to the total area of a plurality of unit panels, are bonded to each other. When the mother substrates are cut into individual panels, a $CO_2$ laser is used as cutting means.

A $CO_2$ laser employs carbon dioxide as a reactive medium, and is operated by exciting carbon dioxide to be in an inverted population state. Since the $CO_2$ laser generates light having a wavelength in an infrared region (10.6 nm), the object irradiated with laser light can be heated.

Figure 14:
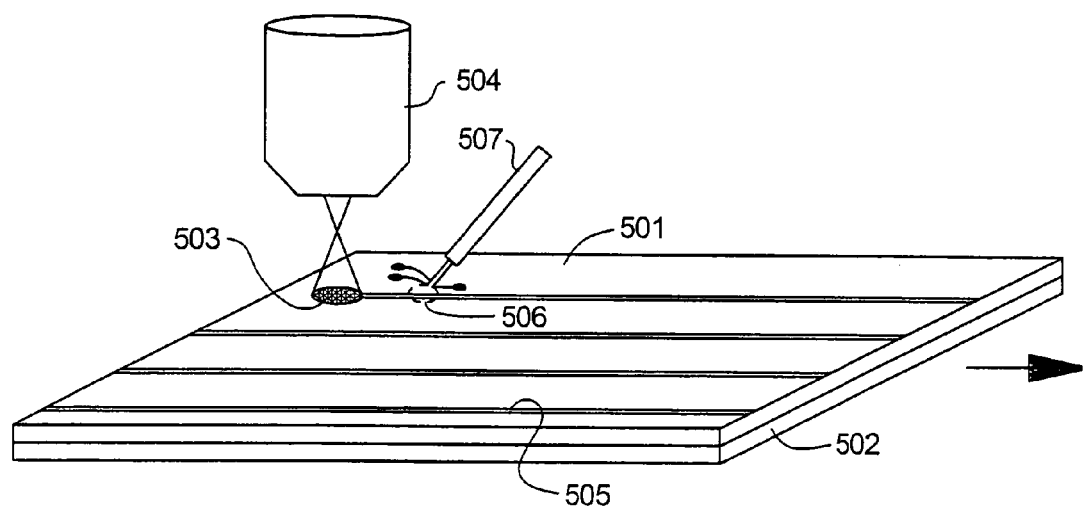
FIG. 14 is a perspective view illustrating a method of cutting a glass substrate by the use of a $CO_2$ laser in Embodiment 2.
Figure 15:
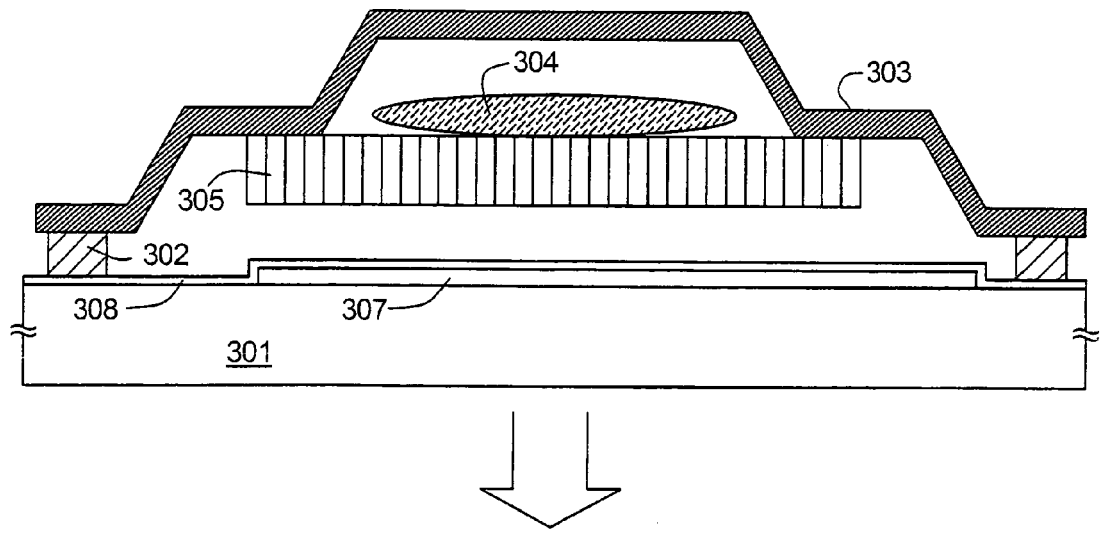
FIG. 15 is a cross-sectional view showing a display device using a conventional organic light-emitting element.

A method of cutting a glass substrate using a $CO_2$ laser will be described with reference to a perspective view of FIG. 14. FIG. 14 is a perspective view showing a method of cutting a glass substrate 501 irradiated with laser, of the glass substrates 501 and 502 that are bonded to each other. An ellipsoidal laser beam spot 503 is radiated onto the glass substrate 501 moving in the direction indicated by the arrow by an optical system 504 for performing laser radiation. A refrigerant is sprayed by a nozzle 507 onto the site (cooled site 506) in the rear of the beam spot 503. In this way, the site heated by the laser radiation is subsequently cooled in a quick manner to generate a thermal strain in the glass substrate 501. As a result, the glass substrate 501 is cut along a laser radiation line 505.

As an apparatus for cutting a glass substrate with a $CO_2$ laser, a laser scriber manufactured by Mitsuboshi Diamond Industrial Co. Ltd. can be used. Two mother substrates may be simultaneously cut, or may be cut one by one. It is preferred to cut two mother substrates at a time because the tact of the manufacturing steps is improved to increase the productivity.

By radiating a $CO_2$ laser onto the surface of the glass substrate, the generation of waste by cutting the glass substrate can be restrained to prevent defects from occurring. Moreover, since a method of cutting the substrates with a $CO_2$ laser employs both the laser radiation and the spray of a cooling medium, the impact on the substrate is small. As a result, even with a thin mother substrate, it is possible to cut the glass substrate at a high yield.

Embodiment 3

A light-emitting device formed by implementing the present invention can be incorporated to various electric-equipment, and a pixel portion is used as an image display portion. Given as such electronic equipment of the present invention are cellular phones, PDAs, electronic books, video cameras, lap-top computers, and image play back devices with the recording medium, for example, DVD (digital versatile disc), digital cameras, and the like. Specific examples of those are shown in FIGS. 12A to 13C.

Figure 12A:
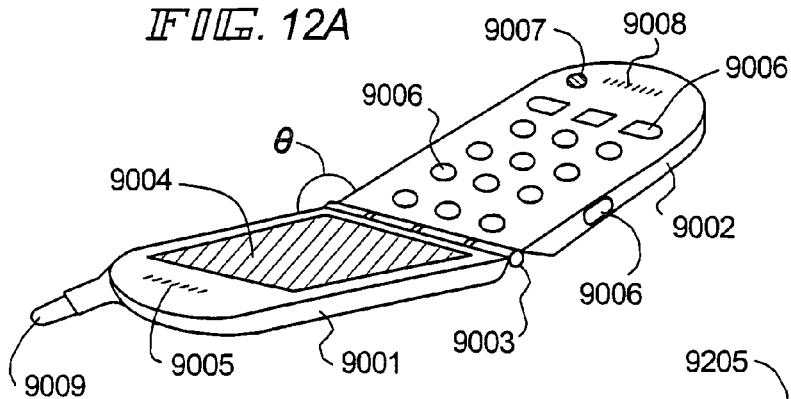
FIGS. 12A to 12D are perspective views illustrating examples of electronic devices of Embodiment 3.

FIG. 12A shows a cellular phone, which is composed of a display panel 9001, an operation panel 9002, and a connecting portion 9003. The display panel 9001 is provided with a display device 9004, an audio output portion 9005, an antenna 9009, etc. The operation panel 9002 is provided with operation keys 9006, a power supply switch 9007, an audio input portion 9008, etc. The present invention is applicable to the display device 9004.

Figure 12B:
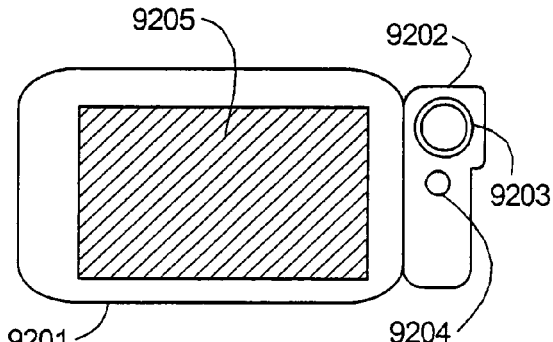

FIG. 12B shows a mobile computer, or a portable information terminal, which is composed of a main body 9201, a camera portion 9202, an image receiving portion 9203, operation switches 9204, and a display device 9205. The present invention can be applied to the display device 9205. In such electronic devices, the display device of 3 to 5 inches is employed, however, by employing the display device of the present invention, the reduction of the weight in the portable information terminal can be attained.

Figure 12C:
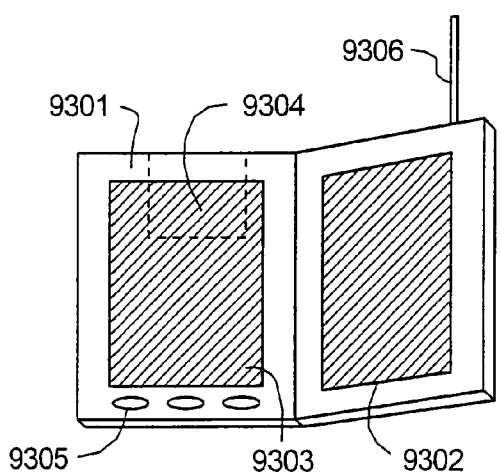

FIG. 12C shows a portable book, which is composed of a main body 9301, display devices 9302 to 9303, and a memory medium 9304, an operation switch 9305, and an antenna 9306, and which displays the data recorded in MD or DVD and the data received by the antenna. The present invention can be applied to the display devices 9302 to 9303. In the portable book, the display device of the 4 to 12 inches is employed. However, by employing the display device of the present invention, the reduction of the weight and thickness in the portable book can be attained.

Figure 12D:
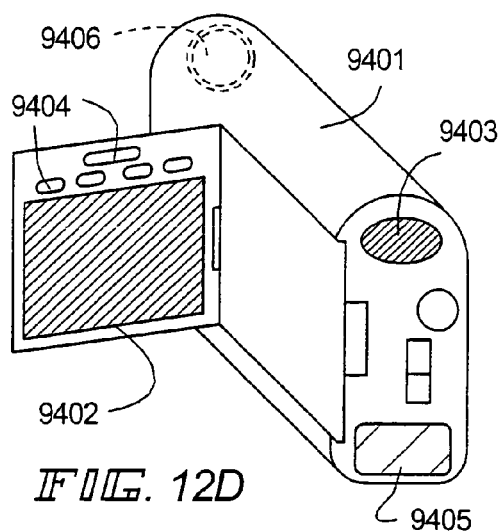

FIG. 12D shows a video camera, which is composed of a main body 9401, a display device 9402, an audio input portion 9403, operation switches 9404, a battery 9405, an image receiving portion 9406, and the like. The present invention can be applied to the display device 9402.

Figure 13A:
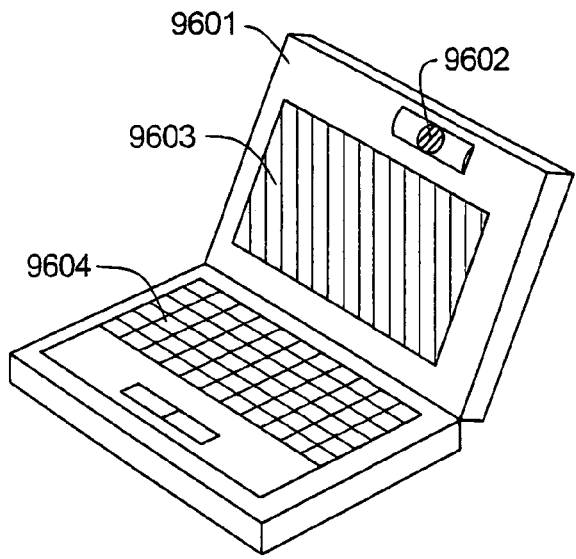
FIGS. 13A to 13C are perspective views illustrating examples of electronic devices of Embodiment 3.

FIG. 13A shows a personal computer, which is composed of a main body 9601, an image input portion 9602, a display device 9603, and a key board 9604. The present invention can be applied to the display device 9603.

Figure 13B:
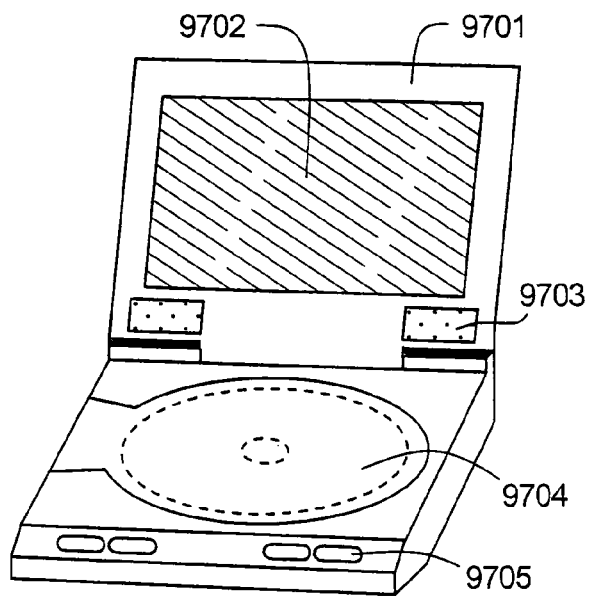

FIG. 13B shows a player employing a recording medium with programs recorded thereon (hereinafter referred to as recording medium), which is composed of a main body 9701, a display device 9702, a speaker portion 9703, a recording medium 9704, and an operation switch 9705. The device employs DVD (digital versatile disc), CD, etc. as the recording medium so that music can be listened, movies can be seen and games and Internet can be done. The present invention can be applied to the display device 9702.

Figure 13C:
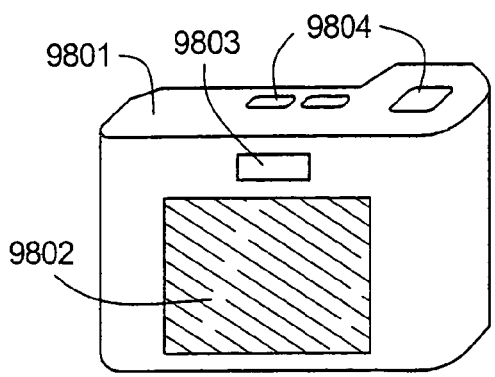

FIG. 13C shows a digital camera, which is composed of a main body 9801, a display device 9802, an eyepiece portion 9803, an operation switch 9804, and an image receiving portion (not shown). The present invention can be applied to the display device 9802.

The display device of the present invention is employed in the cellular phones in FIG. 12A, the mobile computer or the portable information terminal in FIG. 12B, the portable book in FIG. 12C, and the personal computer in FIG. 13A. The display device can reduce the power consumption of the above device by displaying the black background in a standby mode.

In the operation of the cellular phone shown in FIG. 12A, luminance is lowered when the operation keys are used, and the luminance is raised after usage of the operation switch, whereby the low power consumption can be realized. Further, the luminance of the display device is raised at the receipt of a call, and the luminance is lowered during a call, whereby the low power consumption can be realized. Besides, in the case where the cellular phone is continuously used, the cellular phone is provided with a function of turning off a display by time control without resetting, whereby the low power consumption can be realized. Note that the above operations may be conducted by manual control.

The present invention can be applied to the display device which is employed in a navigation system, a refrigerator, a washing machine, a micro-wave oven, a telephone, a fax machine, etc. As described above, the applicable range of the present invention is so wide that the present invention can be applied to various products.

According to the present invention, since the element substrate and the sealing substrate can be provided in the proximity, the amount of water entering the display device through its side face can be reduced.

On the first substrate having the light-emitting element provided thereon, the total thicknesses of the layers deposited in the peripheral area of the first substrate, the pixel portion and the driving circuit portion are equalized with each other. Then, the adhesive is provided as thin as possible in the peripheral area of the first substrate so as to bond a second substrate to the first substrate. As a result, the distance between the first substrate and the second substrate can be made uniform throughout the peripheral area of the first substrate, the pixel portion and the driving circuit portion. More desirably, if the thickness of the laminate film deposited in the peripheral area of the first substrate is reduced by the thickness of the adhesive provided in the peripheral area of the first substrate, the distance between the first substrate and the second substrate can be made uniform throughout the peripheral area of the first substrate, the pixel portion and the driving circuit portion. To achieve this uniformity, it is recommended that among the layers deposited in the pixel portion, at least the second interlayer insulating film having a dominant thickness and the second insulating film formed of the same layer as the bank are formed below the adhesive.

Moreover, since the protective film for the organic light-emitting element is also provided on the side faces of the laminate film in the peripheral area of the first substrate, water can be prevented from entering the display device through its side faces.

What is claimed is:

1. A method of manufacturing a display device including an organic light-emitting element including an organic compound film sandwiched between a first electrode and a second electrode, comprising the steps of:

selectively forming the first electrode over a first substrate;

forming an insulating film over the first electrode and the first substrate;

patterning the insulating film to form a first insulating film covering an end of the first electrode and a second insulating film with a width of 100 to 5000 μm provided in a periphery of the first substrate;

forming an organic compound film on the first electrode;

forming the second electrode on the organic compound film;

providing an adhesive layer on the second insulating film; and bonding the first substrate and a second substrate to each other with the second insulating film and the adhesive layer interposed therebetween under an inert gas or a nitrogen atmosphere.

2. A method of manufacturing a display device claim 1, further comprising, between the step of forming the second electrode and the step of providing the adhesive layer, a step of providing a protective film covering the first insulating film, the second insulating film and the second electrode.

3. A method of manufacturing a display device according to claim 1, wherein the second insulating film has a thickness of 1.0 to 10 µm.

4. A method of manufacturing a display device according to claim 1, wherein the second insulating film is made of any one of a polyimide resin film, an acrylic resin film, and a polyamide resin film.

5. A method of manufacturing a display device according to claim 1, wherein the adhesive layer is provided to have a thickness of 0.05 to 0.5 µm.

6. A method of manufacturing a display device including an organic light-emitting element including an organic compound film sandwiched between a first electrode and a second electrode, comprising the steps of:
    selectively forming the first electrode over a first substrate;
    forming an insulating film over the first electrode and the first substrate;
    patterning the insulating film to form a first insulating film covering an end of the first electrode and a second insulating film with a width of 100 to 5000 µm provided in a periphery area of the first substrate;
    forming an organic compound film on the first electrode;
    forming the second electrode on the organic compound film;
    providing an adhesive layer which covers the first insulating film, the second insulating film and the second electrode; and
    bonding the first substrate and a second substrate to each other with the second insulating film and the adhesive layer interposed therebetween under an inert gas or a nitrogen atmosphere.

7. A method of manufacturing a display device claim 6, further comprising, between the step of forming the second electrode and the step of providing the adhesive layer, a step of providing a protective film covering the first insulating film, the second insulating film and the second electrode.

8. A method of manufacturing a display device according to claim 6, wherein the second insulating film has a thickness of 1.0 to 10 µm.

9. A method of manufacturing a display device according to claim 6, wherein the second insulating film is made of any one of a polyimide resin film, an acrylic resin film, and a polyamide resin film.

10. A method of manufacturing a display device according to claim 6, wherein, subsequent to the step bonding the first substrate and the second substrate, the first substrate and the second substrate are cut by a $CO_2$ laser.

11. A method of manufacturing a display device according to claim 6, wherein the adhesive layer is provided to have a thickness of 0.05 to 0.5 µm.

12. A method of manufacturing a display device including an organic light-emitting element including an organic compound film sandwiched between a first electrode and a second electrode, comprising the steps of:
    selectively forming the first electrode over a first substrate;
    forming a first insulating film over the first electrode and the first substrate;
    patterning the first insulating film to form a second insulating film covering an end of the first electrode and a third insulating film with a width of 100 to 5000 µm provided in a periphery of the first substrate;
    forming a fourth insulating film;
    patterning the fourth insulating film to provide a convex-shaped fifth insulating film at least on an upper face of the first insulating film;
    forming an organic compound film on the first electrode so as to be in contact with a side face of the second insulating film;
    forming the second electrode on the organic compound film;
    forming an adhesive layer on the third insulating film; and
    bonding the first substrate and a second substrate to each other with the third insulating film and the adhesive layer interposed therebetween under an inert gas or a nitrogen atmosphere.

13. A method of manufacturing a display device according to claim 12, further comprising, between the step of forming the second electrode and the step of forming the adhesive layer, a step of providing a protective film covering the second insulating film, the third insulating film, the fifth insulating film and the second electrode.

14. A method of manufacturing a display device according to claim 12, wherein the third insulating film has a thickness of 1.0 to 10 µm.

15. A method of manufacturing a display device according to claim 12, wherein the third insulating film is made of any one of a polyimide resin film, an acrylic resin film, and a polyamide resin film.

16. A method of manufacturing a display device according to claim 12, wherein, subsequent to the step bonding the first substrate and the second substrate, the first substrate and the second substrate are cut by a $CO_2$ laser.

17. A method of manufacturing a display device according to claim 12, wherein the adhesive layer is provided to have a thickness of 0.05 to 0.5 µm.

18. A method of manufacturing a display device including an organic light-emitting element including an organic compound film sandwiched between a first electrode and a second electrode, comprising the steps of:
    selectively forming the first electrode over a first substrate;
    forming an insulating film over the first electrode and the first substrate;
    patterning the insulating film to form a first insulating film covering an end of the first electrode, a second insulating film with a width of 100 to 5000 µm provided in a periphery of the first substrate, and a third insulating film provided between the first insulating film and the second insulating film;
    forming the organic compound film on the first electrode;
    forming the second electrode on the organic compound film;
    filling a gap between the second insulating film and the third insulating film with a desiccant;
    forming a layer having adhesion on the second insulating film; and
    bonding the first substrate and a second substrate to each other with the second insulating film and the adhesive layer interposed therebetween under an inert gas or a nitrogen atmosphere.

19. A method of manufacturing a display device according to claim 18, further comprising, between the step of forming the second electrode and the step of filling a gap between the second insulating film and the third insulating film, a step of providing a protective film covering the first insulating film, the second insulating film, the third insulating film and the second electrode.

20. A method of manufacturing a display device according to claim 18, wherein the second insulating film has a thickness of 1.0 to 10 µm.

21. A method of manufacturing a display device according to claim 18, wherein the second insulating film is made of any one of a polyimide resin film, an acrylic resin film, and a polyamide resin film.

22. A method of manufacturing a display device according to claim 18, wherein, subsequent to the step bonding the first substrate and the second substrate, the first substrate and the second substrate are cut by a $CO_2$ laser.

23. A method of manufacturing a display device according to claim 18, wherein the adhesive layer is provided to have a thickness of 0.05 to 0.5 μm.

24. A method of manufacturing display devices each including an organic light-emitting element including an organic compound film sandwiched between a first electrode and a second electrode, comprising the steps of:
   selectively forming the first electrode over a first substrate;
   forming an insulating film over the first electrode and the first substrate;
   patterning the insulating film to form a first insulating film covering an end of the first electrode and a second insulating film provided in a periphery of the first substrate;
   forming an organic compound film on the first electrode;
   forming the second electrode on the organic compound film;
   providing an adhesive layer on the second insulating film;
   bonding the first substrate and a second substrate to each other with the second insulating film and the adhesive layer interposed therebetween under an inert gas or a nitrogen atmosphere; and
   cutting the first substrate and the second substrate by a $CO_2$ laser to form the display devices.

25. A method of manufacturing a display device claim 24, further comprising, between the step of forming the second electrode and the step of providing the adhesive layer, a step of providing a protective film covering the first insulating film, the second insulating film and the second electrode.

26. A method of manufacturing a display device according to claim 24, wherein the second insulating film has a width of 100 to 5000 μm.

27. A method of manufacturing a display device according to claim 24, wherein the second insulating film has a thickness of 1.0 to 10 μm.

28. A method of manufacturing a display device according to claim 24, wherein the second insulating film is made of any one of a polyimide resin film, an acrylic resin film, and a polyamide resin film.

29. A method of manufacturing a display device according to claim 24, wherein the adhesive layer is provided to have a thickness of 0.05 to 0.5 μm.

30. A method of manufacturing a display device according to claim 24, wherein a refrigerant is sprayed by a nozzle onto one of the first substrate and the second substrate during the cutting step.

31. A method of manufacturing a display device according to claim 24, wherein the first substrate and the second substrate are simultaneously cut during the cutting step.

* * * * *

UNITED STATES PATENT AND TRADEMARK OFFICE
CERTIFICATE OF CORRECTION

| | | |
|---|---|---|
| PATENT NO. | : 7,662,011 B2 | Page 1 of 1 |
| APPLICATION NO. | : 11/319048 | |
| DATED | : February 16, 2010 | |
| INVENTOR(S) | : Yamazaki et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1041 days.

Signed and Sealed this

Thirtieth Day of November, 2010

David J. Kappos
*Director of the United States Patent and Trademark Office*